United States Patent [19]

Ohsawa

[11] Patent Number: 5,521,873
[45] Date of Patent: May 28, 1996

[54] SEMICONDUCTOR DYNAMIC RANDOM ACCESS MEMORY

[75] Inventor: Takashi Ohsawa, Yokohama, Japan

[73] Assignee: Kabushiki Kaisha Toshiba, Kawasaki, Japan

[21] Appl. No.: 175,559

[22] Filed: Dec. 30, 1993

[30] Foreign Application Priority Data

Mar. 10, 1993 [JP] Japan ................................ 5-049700

[51] Int. Cl.⁶ ............................................ G11C 11/413
[52] U.S. Cl. ........................... 365/193; 365/233; 365/236
[58] Field of Search ............................... 365/193, 233.5, 365/236, 233

[56] References Cited

U.S. PATENT DOCUMENTS

| | | | |
|---|---|---|---|
| 4,811,299 | 3/1989 | Miyazawa et al. | 365/201 |
| 5,285,409 | 2/1994 | Hwangbo et al. | 365/236 |

FOREIGN PATENT DOCUMENTS 0317014  5/1989  European Pat. Off. .

OTHER PUBLICATIONS

Kraus et al., "*Design for Test of Mbit DRAMs*", 1989 International Test Conference Proceedings, Washington D.C., pp. 316–321, Aug. 1989.

*Primary Examiner*—Tan T. Nguyen
*Attorney, Agent, or Firm*—Banner & Allegretti, Ltd.

[57] ABSTRACT

A DRAM provided with special function modes of a plurality of different types and capable of discriminating the modes and entering a selected one thereof without conflicting with a conventional standardized WCBR entry method. Such a DRAM comprises a counter circuit FF for counting the number of times a /WE signal is made active while a /RAS signal is active after the start of a /WCBR cycle and an entry circuit that discriminates the special function modes and enters the DRAM in a selected one thereof according to the obtained count.

39 Claims, 28 Drawing Sheets

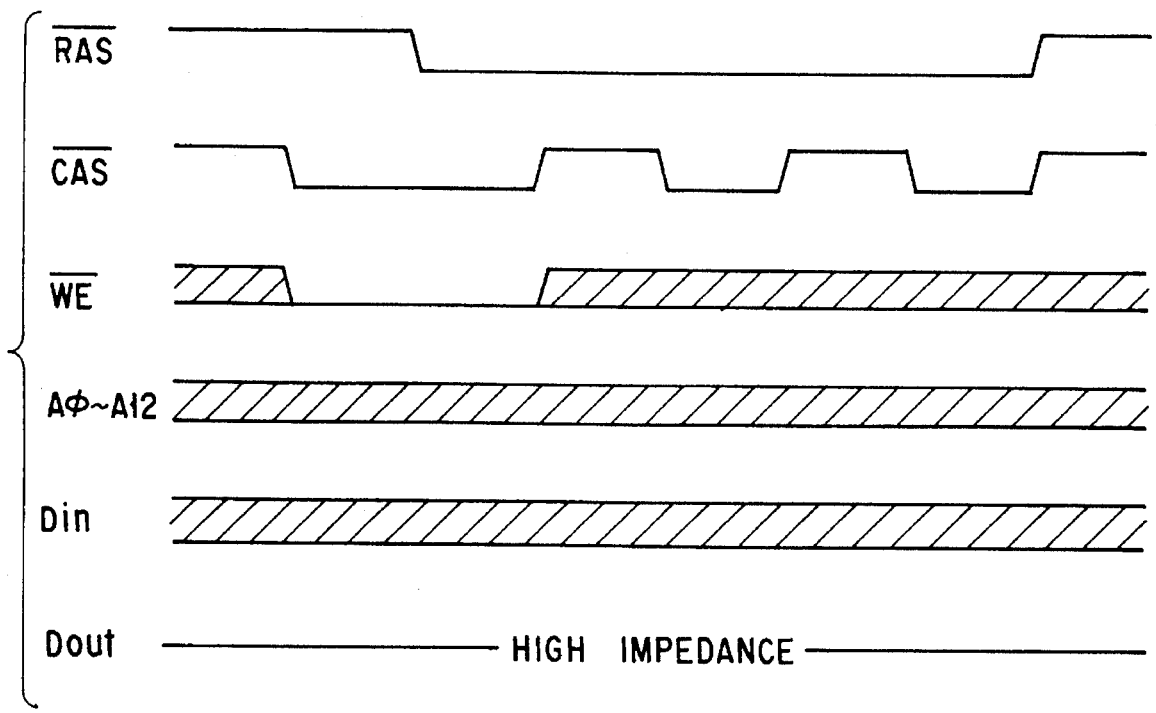
F I G. 5
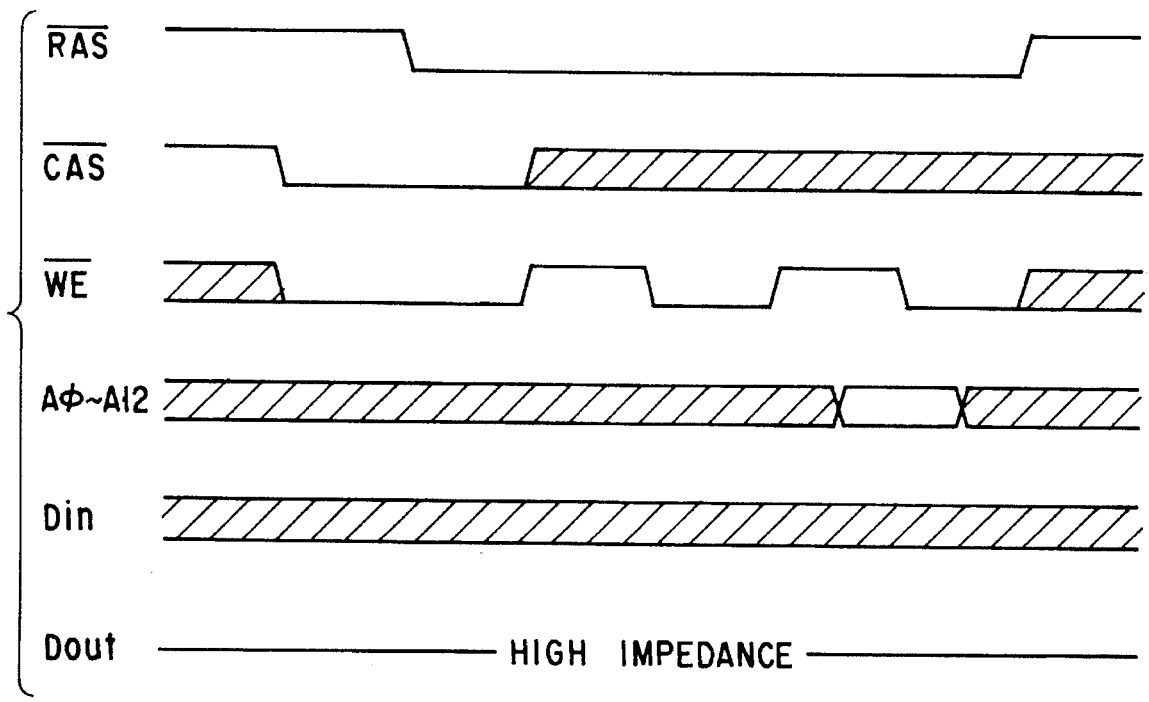
F I G. 6

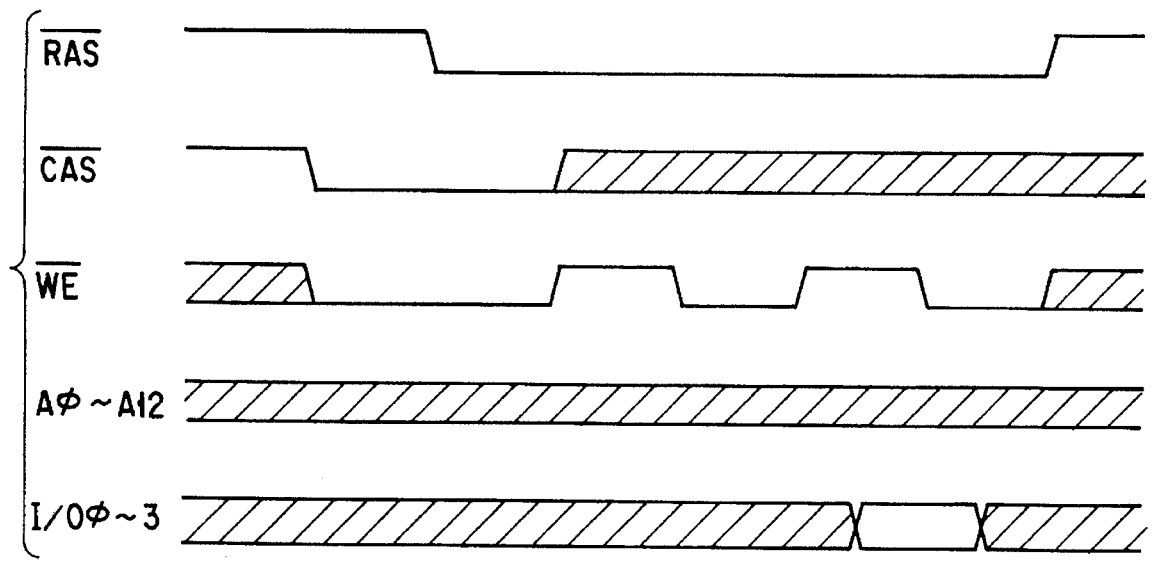
F I G. 9
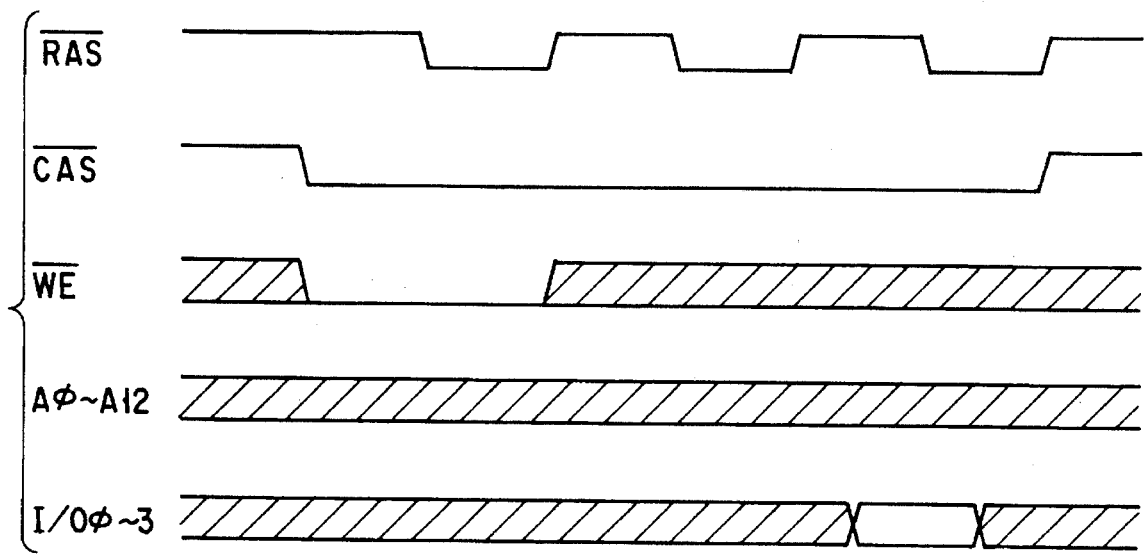
F I G. 10

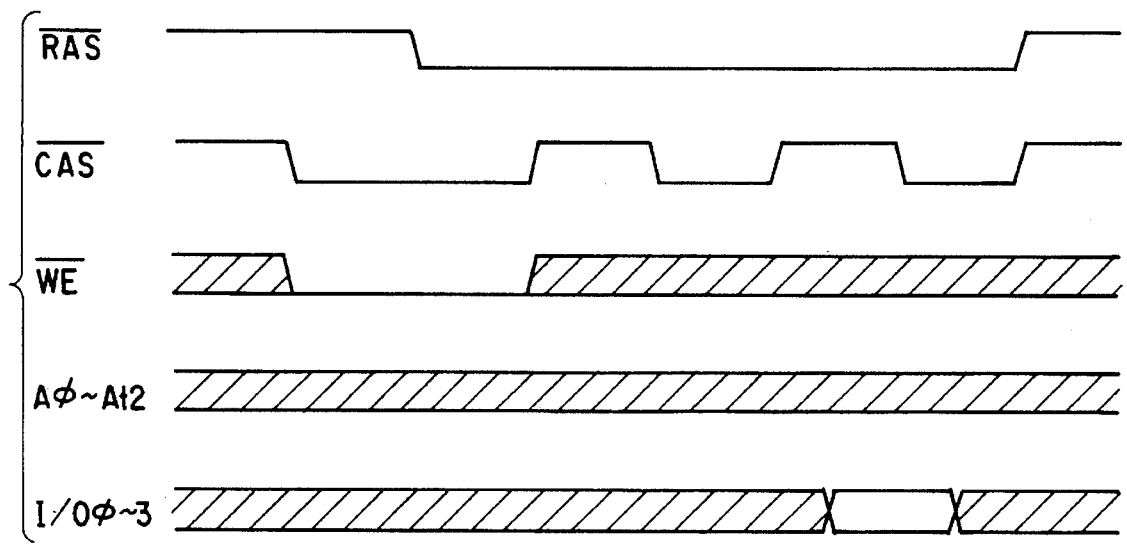
F I G. 11
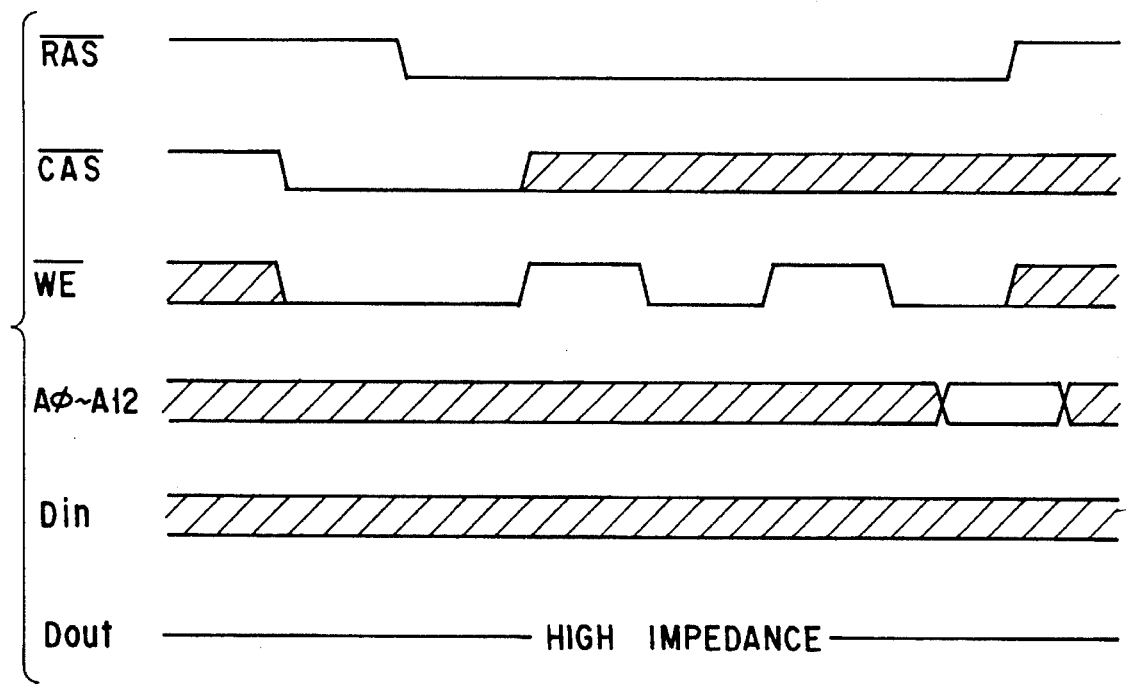
F I G. 12

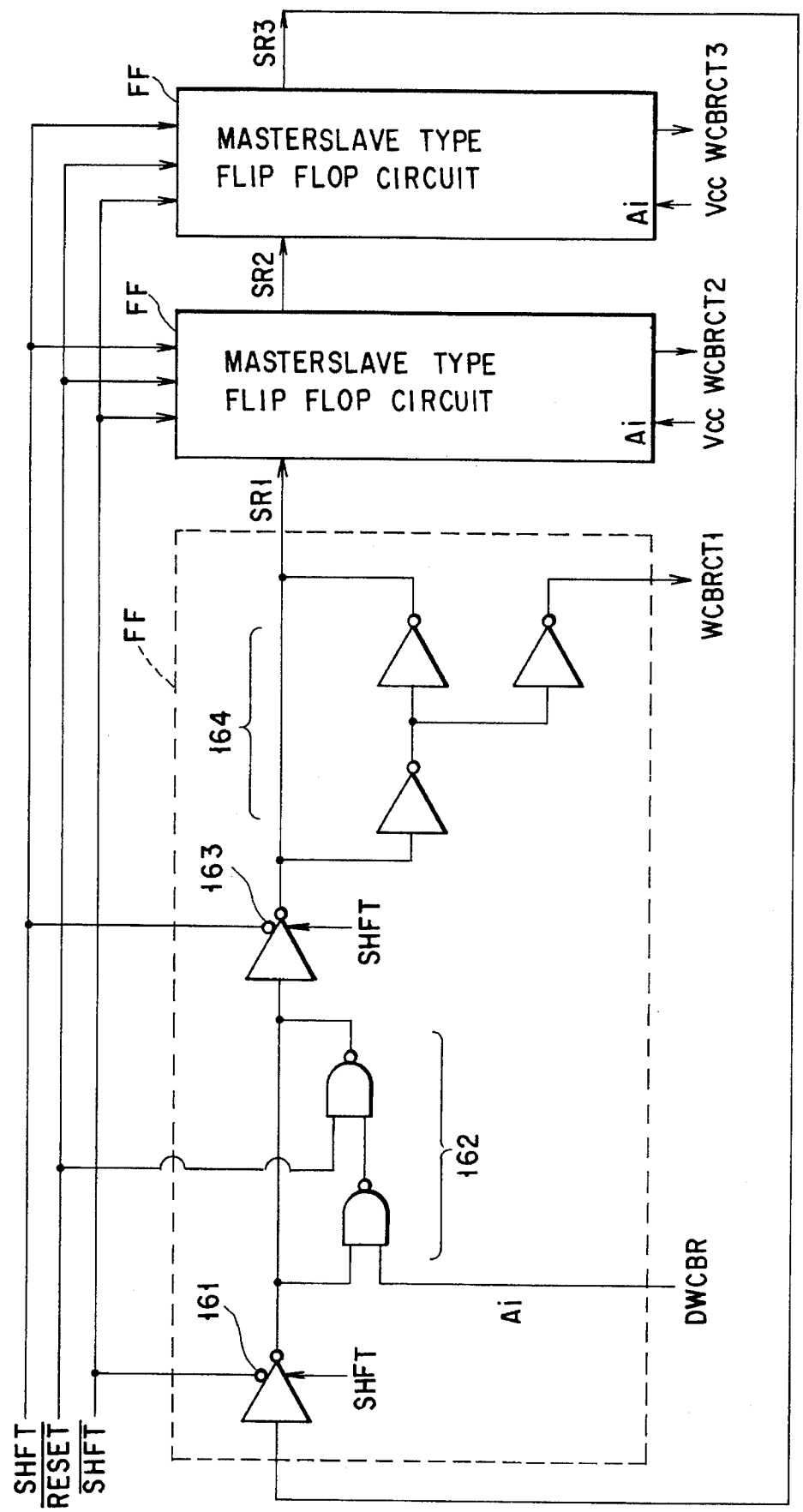
F I G. 18

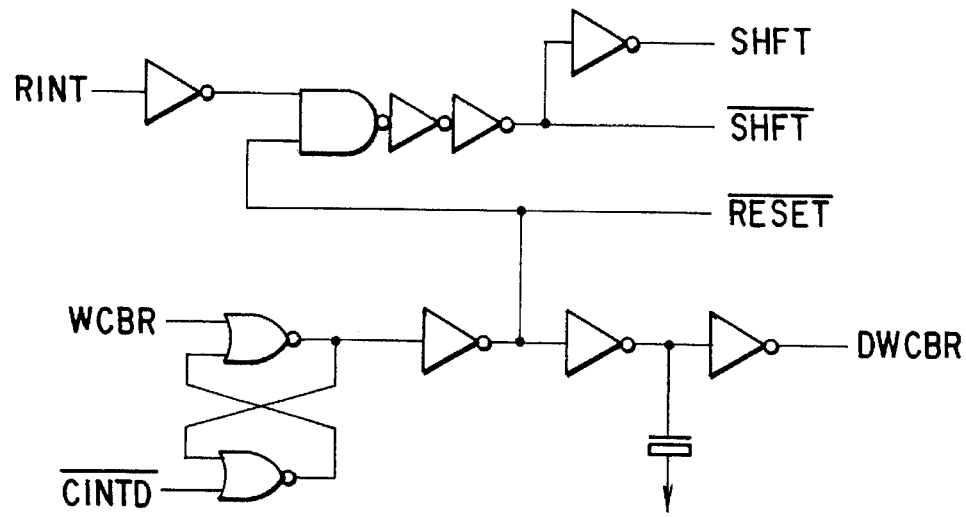
F I G. 22
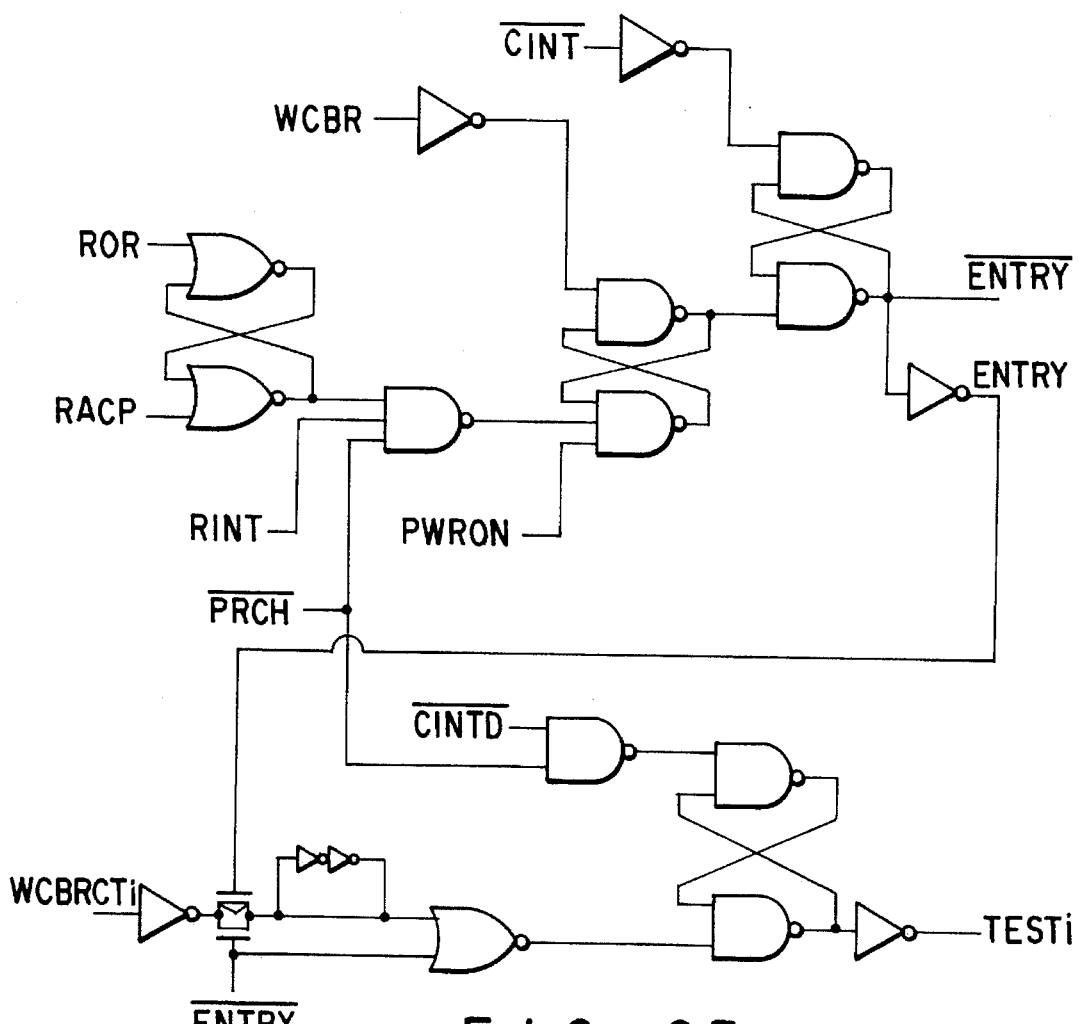
F I G. 23

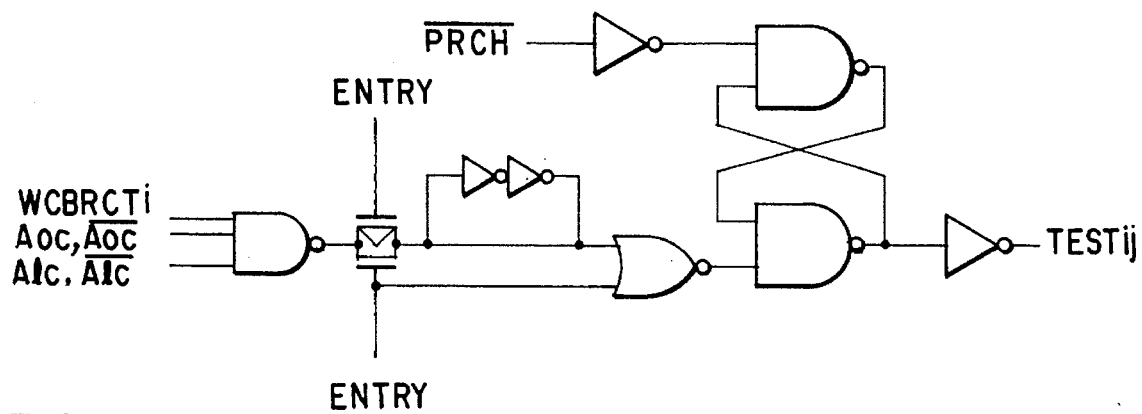
FIG. 27A
FIG. 27B
| TESTi0 | $\overline{Aoc}$ | $\overline{Aℓc}$ |
| TESTi1 | Aoc | $\overline{Aℓc}$ |
| TESTi2 | $\overline{Aoc}$ | Aℓc |
| TESTi3 | Aoc | Aℓc |
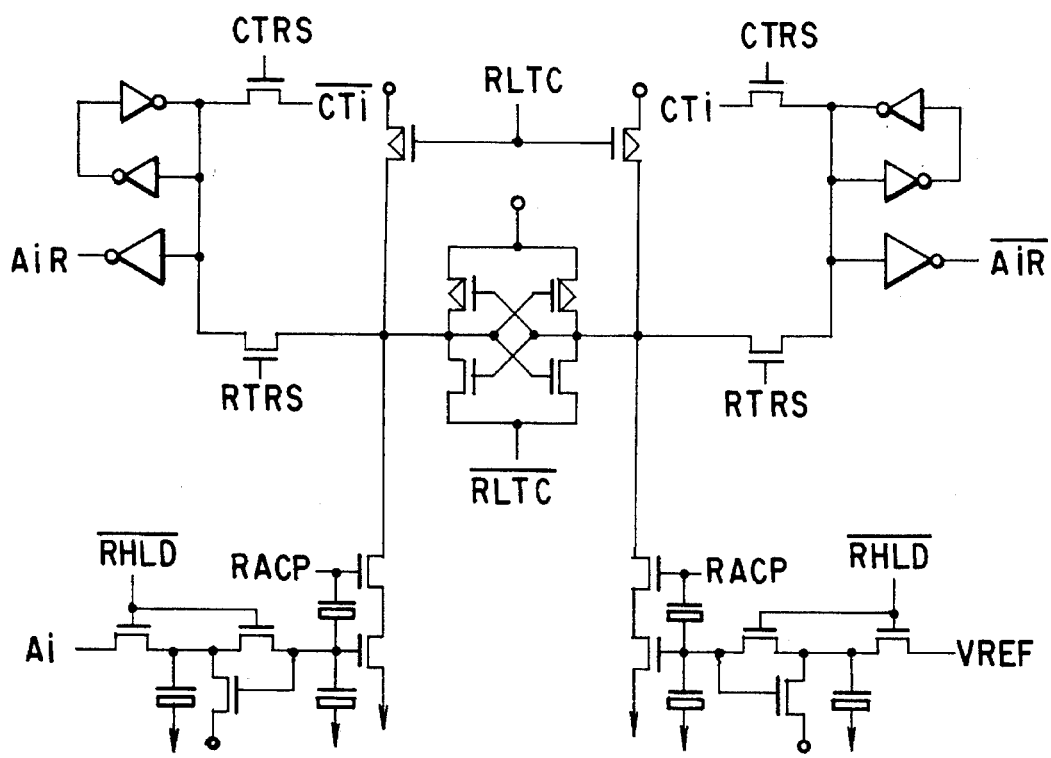
FIG. 29

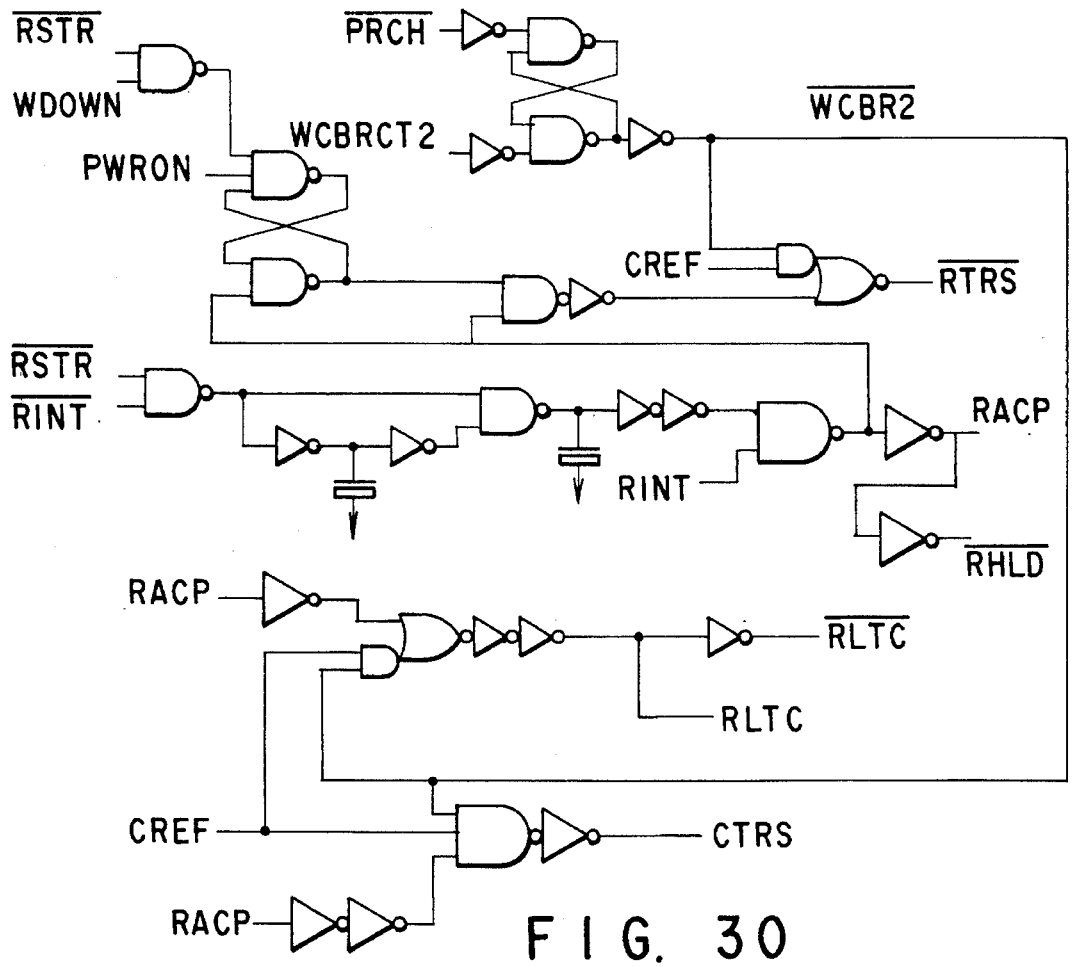
FIG. 30
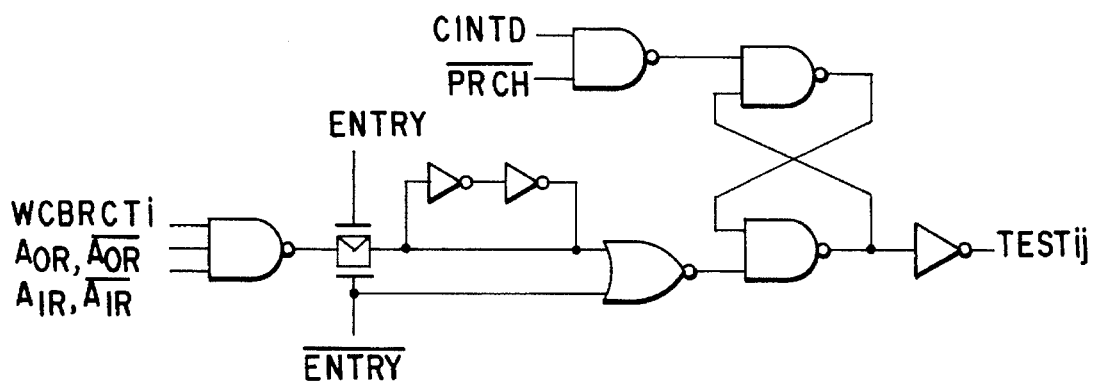
FIG. 31A
| TESTiφ | $\overline{A\phi R}$ | $\overline{A1R}$ |
| TESTi1 | $A\phi R$ | $\overline{A1R}$ |
| TESTi2 | $\overline{A\phi R}$ | $A1R$ |
| TESTi3 | $A\phi R$ | $A1R$ |
FIG. 31B

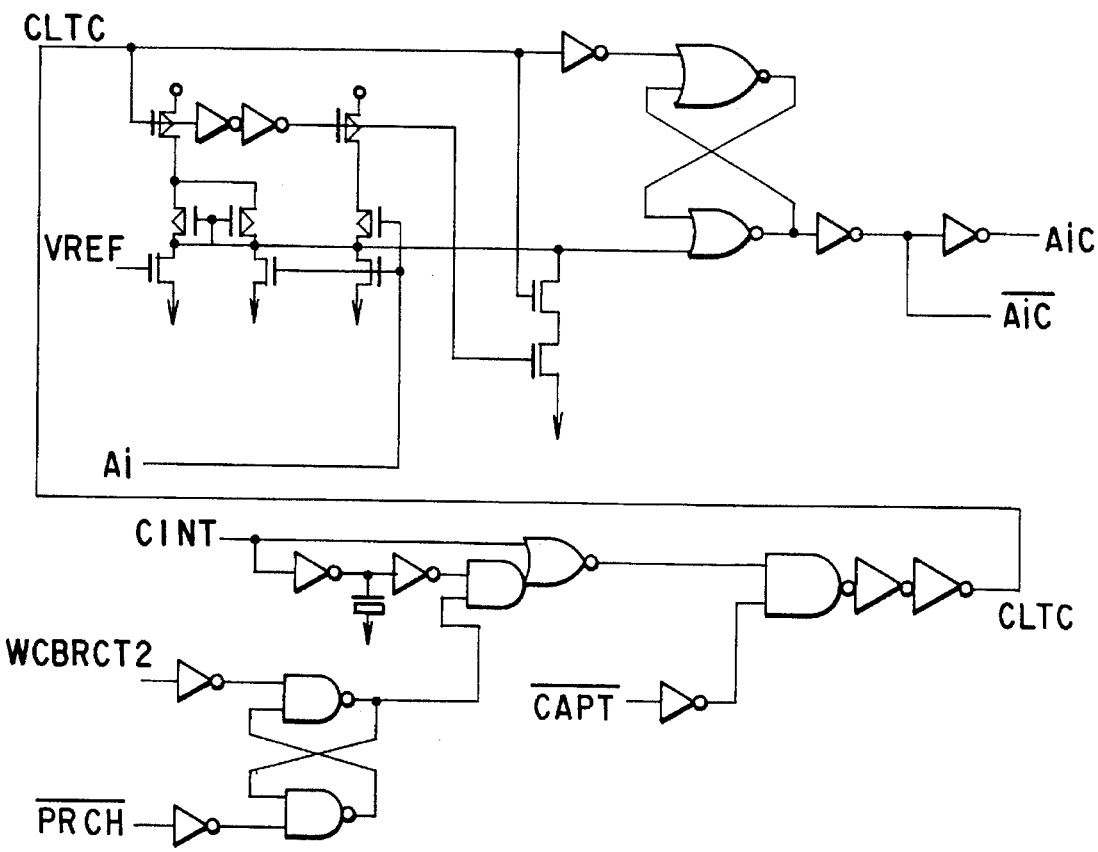
F I G. 34
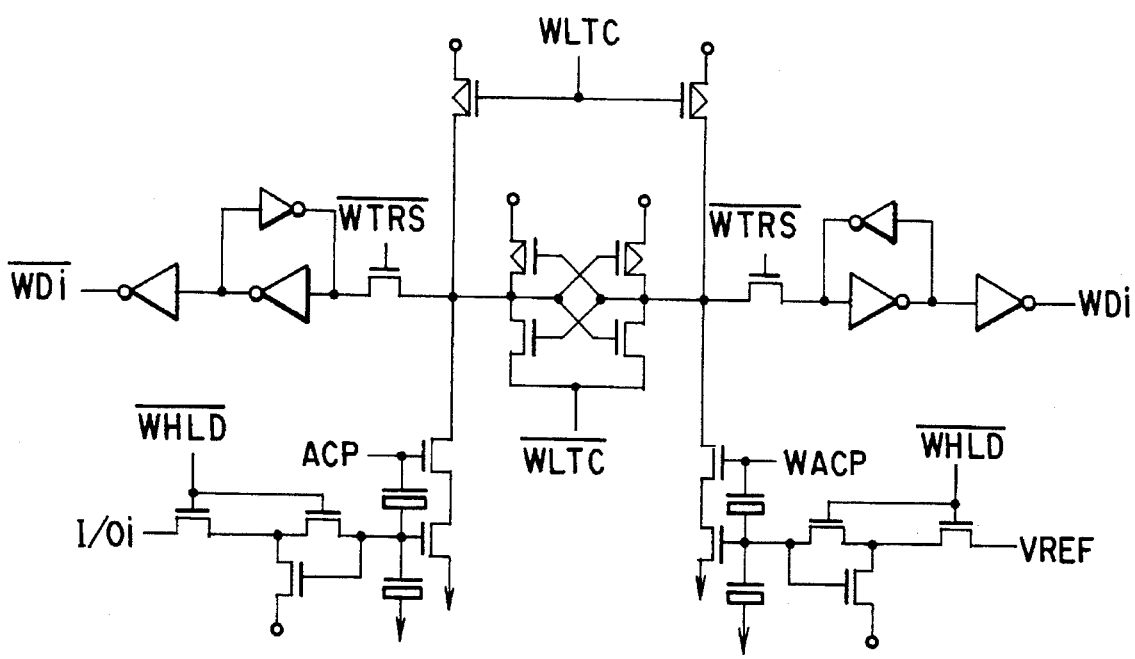
F I G. 36

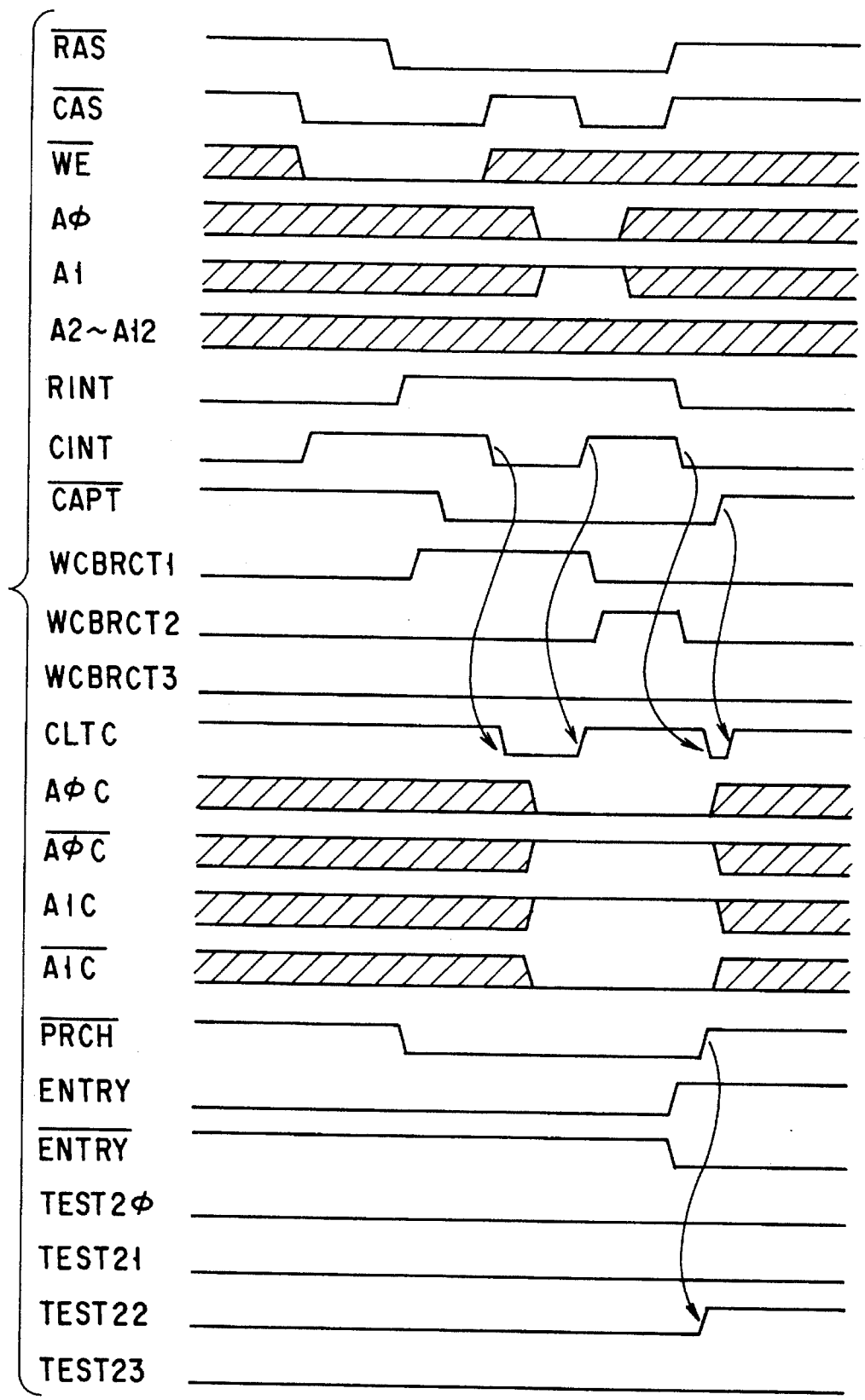
F I G. 35

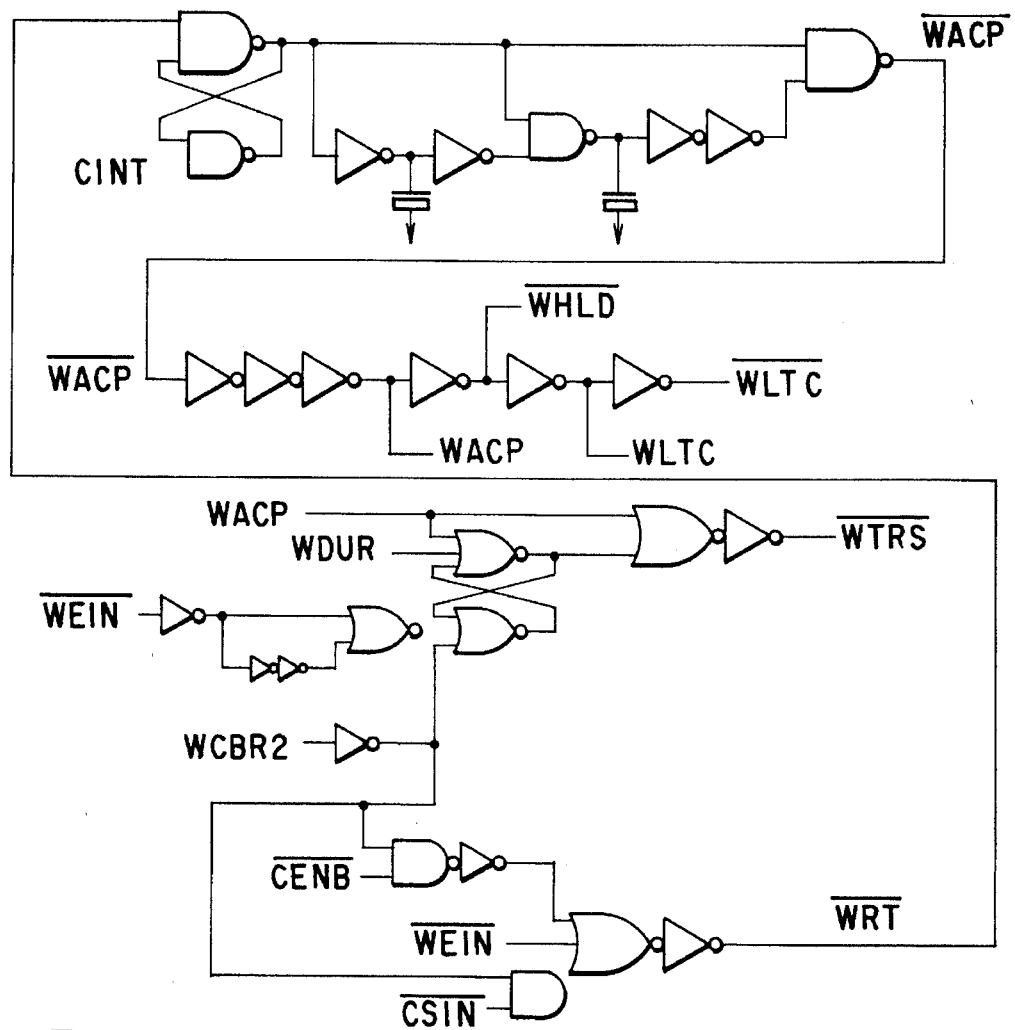
FIG. 37
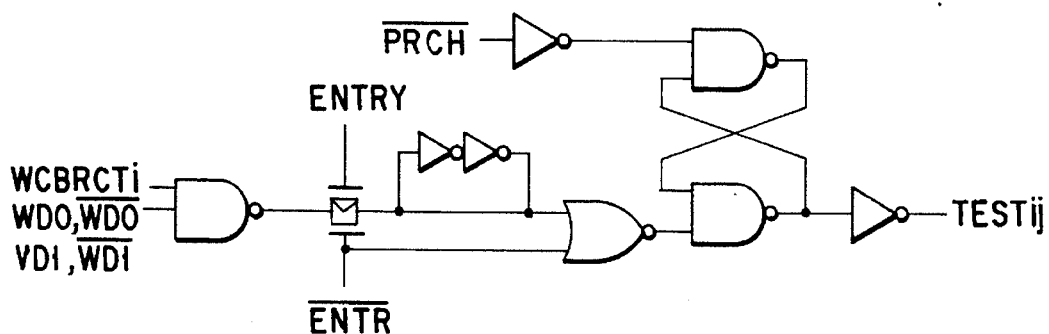
FIG. 38A
| TESTiφ | WDφ | WD1 |
| --- | --- | --- |
| TESTi1 | WDφ | WD1 |
| TESTi2 | WDφ | WD1 |
| TESTi3 | WDφ | WD1 |
FIG. 38B

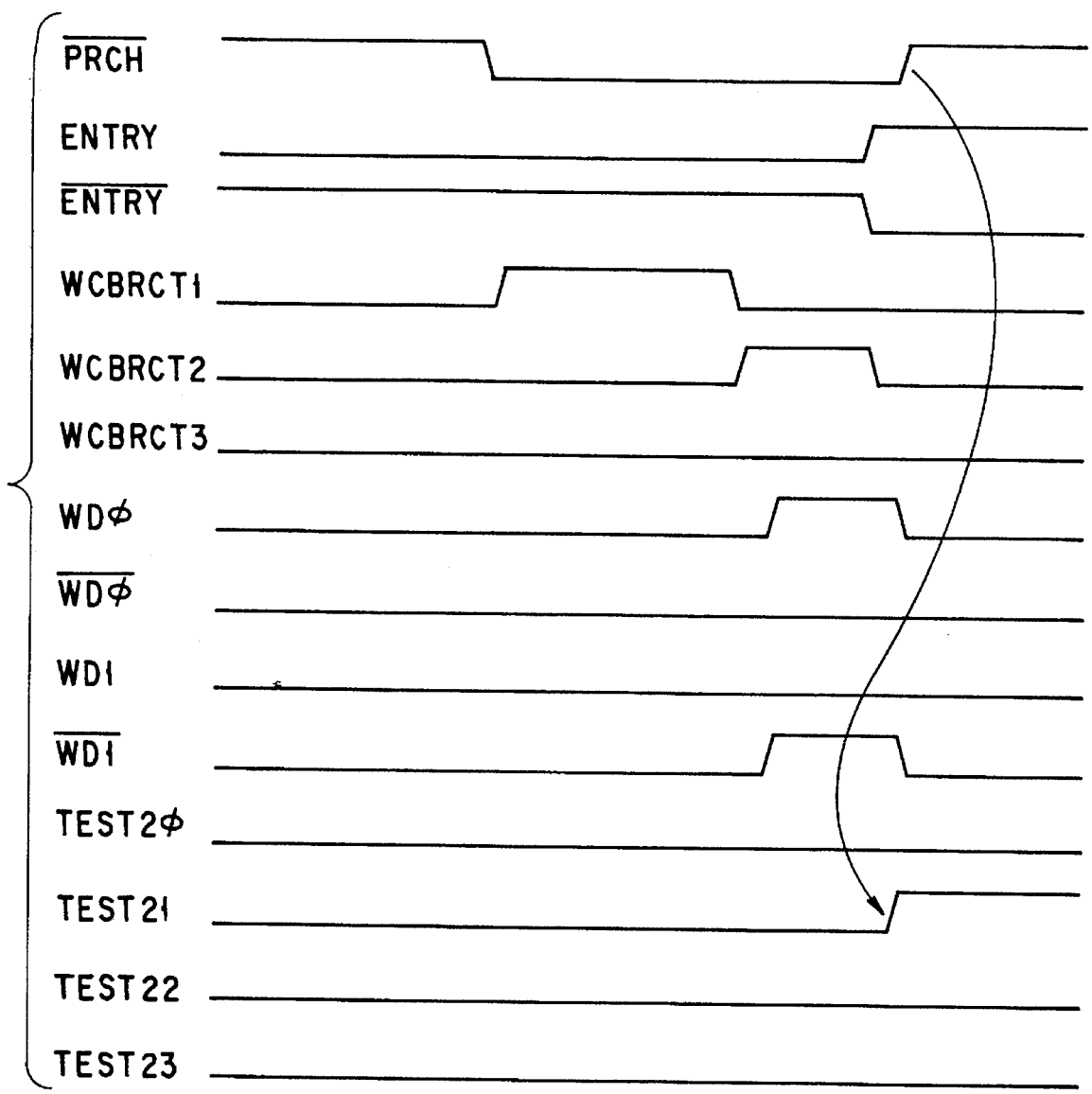
F I G. 40

SEMICONDUCTOR DYNAMIC RANDOM ACCESS MEMORY

BACKGROUND OF THE INVENTION

1. Field of the Invention

This invention relates to a semiconductor dynamic random access memory (DRAM) and, more particularly, it relates to a circuit adapted to discriminate special function modes of a plurality of different types with which it is provided and entering the memory in a selected one them.

2. Description of the Related Art

Known specific function modes for a DRAM typically include parallel bit test modes. An 8-bit parallel test mode and a 16-bit parallel test mode are provided as standardized modes for a 4M DRAM adapted for 4M-word×1-bit and a 16M DRAM adapted for 16M-word×1-bit respectively.

The operation of entering a DRAM of the above identified category in a parallel bit test mode is normally carried out in a WCBR cycle as illustrated in the waveform in FIG. 1 of the accompanying drawings, although this technique is by no means usual for entering DRAMs of other categories. A WCBR cycle is a WE·CAS before RAS cycle where a /WE (write enable signal) and a /CAS (column address strobe signal) are made to become active before a /RAS (row address strobe signal). For a WCBR cycle, the address inputs A0 to A12 and the write data input Din of the DRAM may be held in any state whereas its data output Dout is always kept in an open state (high impedance state).

When a DRAM is provided with two or more than two special function modes, it has been a common practice to discriminate them by specifying a state for each of the address inputs in a WCBR cycle as illustrated in FIG. 2 of the accompanying drawings.

However, the latter entry method of specifying a state for each of the address inputs in a WCBR cycle can inevitably restrict the use of the former method (which may keep the address inputs in any state) to the disadvantage of the user and hence is currently not popular.

On the other hand, in a WCBR cycle which is a currently normally used for entering a DRAM in a special function mode out of a number of special function modes with which it is provided, the memory device is automatically refreshed by the internal row address counter of the DRAM. Contrary to this, with the latter entry method of specifying just a mode for each of the address inputs of a DRAM, its row address buffer needs to be operated and therefore the method is not compatible with the technique of automatic refresh using the internal address counter unless the entry circuit of the DRAM is modified to a considerable extent.

Thus, with a DRAM provided with special function modes of two or more than two different types, the conventional method of discriminating the special function modes for entering the memory device in one of them is accompanied by a problem of being not very convenient to the user.

SUMMARY OF THE INVENTION

In view of the above problem, it is therefore an object of the present invention to provide a semiconductor dynamic random access memory which is compatible with (and hence does not restrict) the conventional WCBR entry method and, if the memory is provided with special function modes of a plurality of different types, still capable of discriminating the modes for memory entry so that the user may handle it with ease.

According to an aspect of the invention, the above object is achieved by providing a DRAM provided with special function modes of a plurality of different types characterized in that it comprises a built-in entry circuit adapted to count the number of times a /WE signal is made active while a /RAS signal remains active since an WCBR cycle has been started to activate a /CAS signal and a /WE signal before a /RAS signal in order to discriminate the special function modes of a plurality of different types for memory entry according to the obtained count. In other words, one of the special function modes of a plurality of different types is selected for memory entry each time a different number is counted.

According to another aspect of the invention, the above object is achieved by providing a DRAM provided with special function modes of a plurality of different types characterized in that it comprises a built-in entry circuit adapted to count the number of times a RAS signal is made active while a /CAS signal remains active since an WCBR cycle has been started to activate a /CAS signal and a /WE signal before a /RAS signal in order to discriminate the special function modes of a plurality of different types for memory entry according to the obtained count. Here again, one of the special function modes of a plurality of different types is selected for memory entry each time a different number is counted.

According to still another aspect of the invention, the above object is achieved by providing a DRAM provided with special function modes of a plurality of different types characterized in that it comprises a built-in entry circuit adapted to count the number of times a CAS signal is made active while a /RAS signal remains active since an WCBR cycle has been started to activate a /CAS signal and a /WE signal before a /RAS signal in order to discriminate the special function modes of a plurality of different types for memory entry according to the obtained count. Once again, one of the special function modes of a plurality of different types is selected for memory entry each time a different number is counted.

Thus, with an entry circuit according to the invention, the number of times a /WE signal is made active while a /RAS signal remains active, the number of times a /RAS signal is made active while a /RAS signal remains active or the number of time with which a /CAS signal is made active while a /RAS signal remains active is counted in order to discriminate the special function modes of a plurality of different types for memory entry according to the obtained count.

The address inputs of a DRAM according to the invention may be in any state for entry and the row address buffer and the address lead-in system connected thereto of the DRAM are identical with their counterparts in a conventional DRAM. Therefore, a DRAM according to the invention can be produced without significantly modifying the circuit configuration of a conventional DRAM.

The user may enter the memory in a selected special function mode simply by determining how many times a /WE signal is made low while a /RAS signal is kept low, a /RAS signal is made low while a /CAS signal is held low or a /CAS signal is made low while a /RAS signal is kept low to discriminate the special function modes with which it is provided.

With such an arrangement, therefore, a memory device according to the invention can be entered in any selected special function mode by discriminating the special function modes with which it is provided without conflicting with (and therefore restricting) the standardized conventional WCBR entry method. Thus, the entry method used in a DRAM according to the invention will be accepted by users without problem.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a waveform timing chart for an exemplary basic operation of a third embodiment of the invention.

FIG. 6 is a waveform timing chart for an exemplary basic operation of a fourth embodiment of the invention.

FIG. 9 is a waveform timing chart for an exemplary basic operation of a seventh embodiment of the invention.

FIG. 10 is a waveform timing chart for an exemplary basic operation of an eighth embodiment of the invention.

FIG. 11 is a waveform timing chart for an exemplary basic operation of a ninth embodiment of the invention.

FIG. 12 is a waveform timing chart for an exemplary basic operation of a tenth embodiment of the invention.

FIG. 18 is a circuit diagram of a counter circuit that can be used for a DRAM according to the invention.

FIG. 22 is a circuit diagram of a counter control circuit that can be used for the second embodiment.

FIG. 23 is a circuit diagram of an entry circuit that can be used for the second embodiment.

FIG. 27A is a circuit diagram of a TESTij generation circuit of an entry circuit and FIG. 27B is a truth table thereof that can be used for the fourth embodiment.

FIG. 29 is a circuit diagram of a row address buffer that can be used for the fifth embodiment.

FIG. 30 is a circuit diagram of a control circuit of the row address buffer of FIG. 29.

FIG. 31A is a circuit diagram of a TESTij generation circuit of an entry circuit and FIG. 31B is a truth table thereof that can be used for the fifth embodiment.

FIG. 34 is a circuit diagram of a column address buffer that can be used for the sixth embodiment.

FIG. 35 is a detailed waveform timing chart for an operation of the sixth embodiment.

FIG. 36 is a circuit diagram of a data input buffer circuit that can be used for the seventh embodiment.

FIG. 37 is a circuit diagram of a control circuit of the buffer circuit of FIG. 36.

FIG. 38A is a circuit diagram of a TESTij generation circuit of an entry circuit and FIG. 38B is a truth table thereof that can be used for the seventh embodiment.

FIG. 40 is the remaining part of the detailed waveform timing chart of FIG. 39.

DETAILED DESCRIPTION OF THE PREFERRED EMBODIMENTS

Now, the present invention will be described in greater detail by referring to the accompanying drawings that illustrate preferred embodiments of the invention.

FIGS. 3 through 17 illustrate basic operations of a plurality of embodiments of the invention. It is assumed herein that a DRAM according to the invention is provided with special function modes of a plurality of different types and compatible with a WCBR cycle where a /CAS signal and a /WE signal are made active (low) before a /RAS signal.

Figure 1:
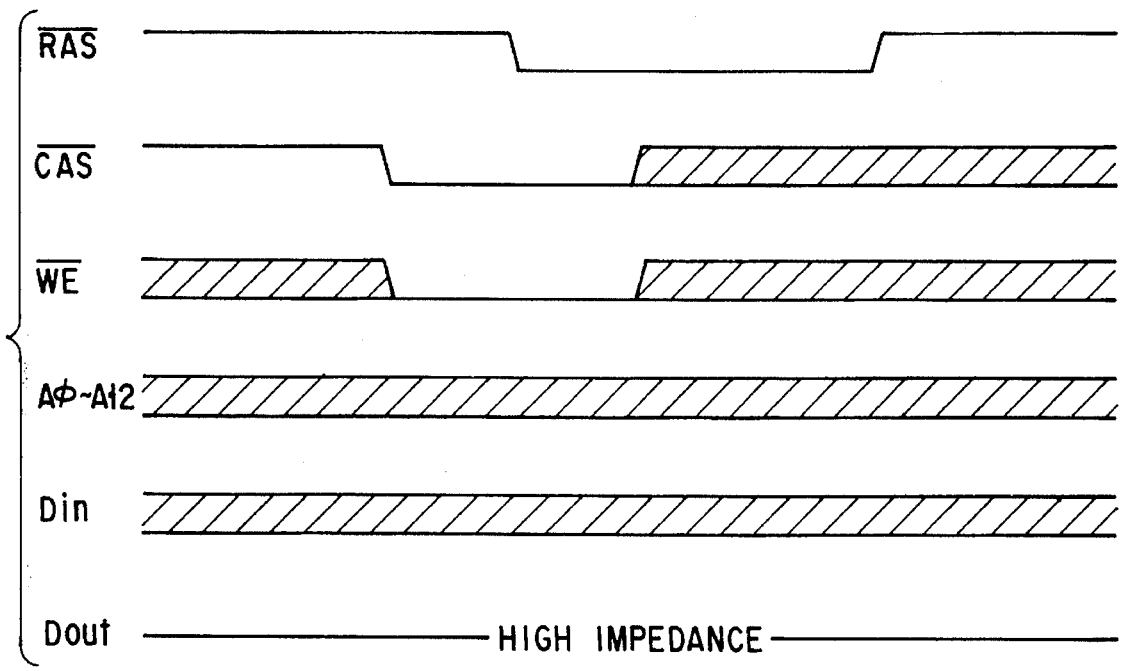
FIG. 1 is a waveform timing chart of a standardized WCBR cycle.
Figure 2:
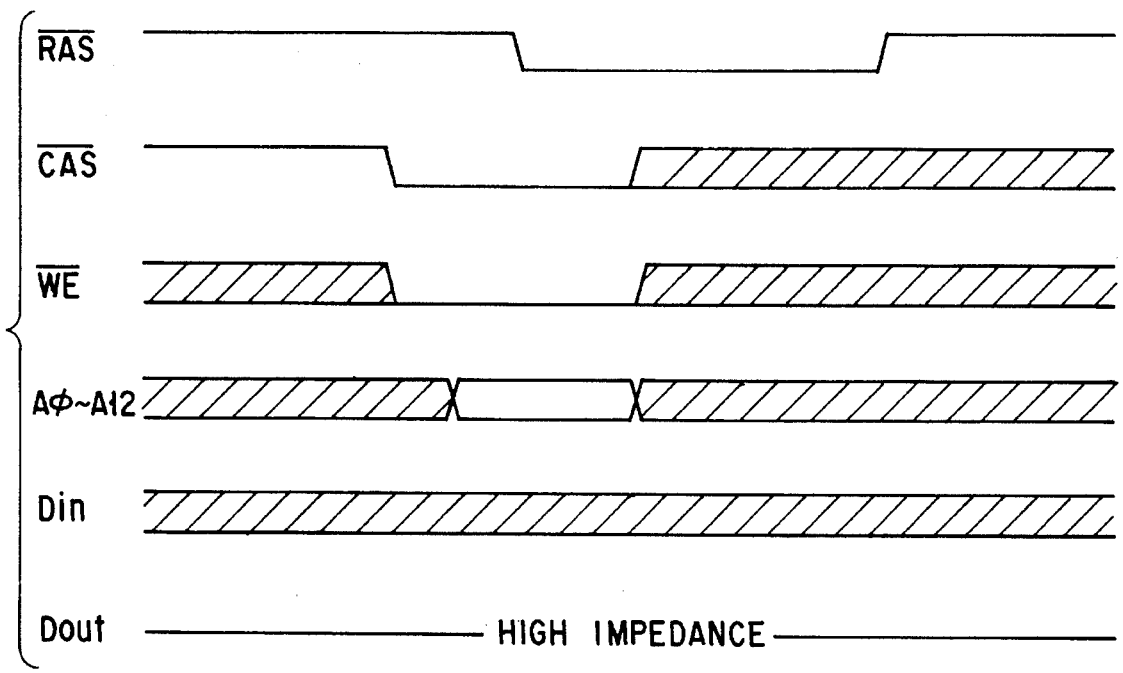
FIG. 2 is a waveform timing chart of a conventional WCBR cycle involving specification of a state for each address input.
Figure 3:
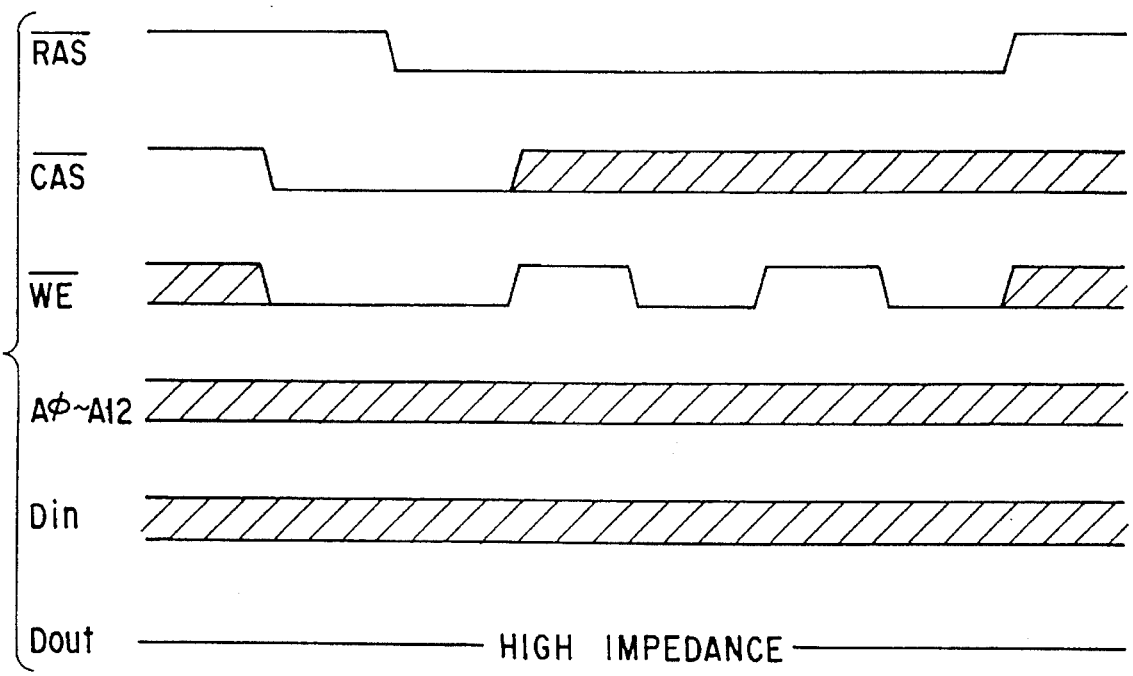
FIG. 3 is a waveform timing chart for an exemplary basic operation of a first embodiment of the invention.

FIG. 3 illustrates an exemplary basic operation of a first embodiment of the invention.

In this first embodiment, the number of times a /WE signal is made low while a /RAS signal is low since a WCBR cycle has been started is counted to discriminate the special function modes with which it is provided according to the obtained count and select one of the modes in which the memory is entered. In other words, each time a different count is obtained, a different one is selected for memory entry out of the special function modes of a plurality of different types. Since the procedure of selecting a mode for entering the memory there according to the obtained count is the same for all the embodiments cited herein, the description thereof will be omitted hereafter. FIG. 3 shows a /WE signal which is made low three times.

The embodiment will be quite acceptable to the user if it is so designed that the memory is ready for entry in a test mode conforming to the JEDEC (Joint Electron Device Engineering Council) norms as in the case of a conventional WCBR cycle when a /WE signal is made low once. If the user wants to enter the memory in a different test mode, he or she may be able to do so by making a WE signal low twice or more than twice. For instance, if the user wants to make a /WE signal low twice and consequently define two different special function modes, he or she may be able to do so by entering the memory in a first special function mode, whereas the user may have to enter the memory in a second special function mode if he or she wants to make a /WE signal low three times and consequently define three different special function modes.

Figure 4:
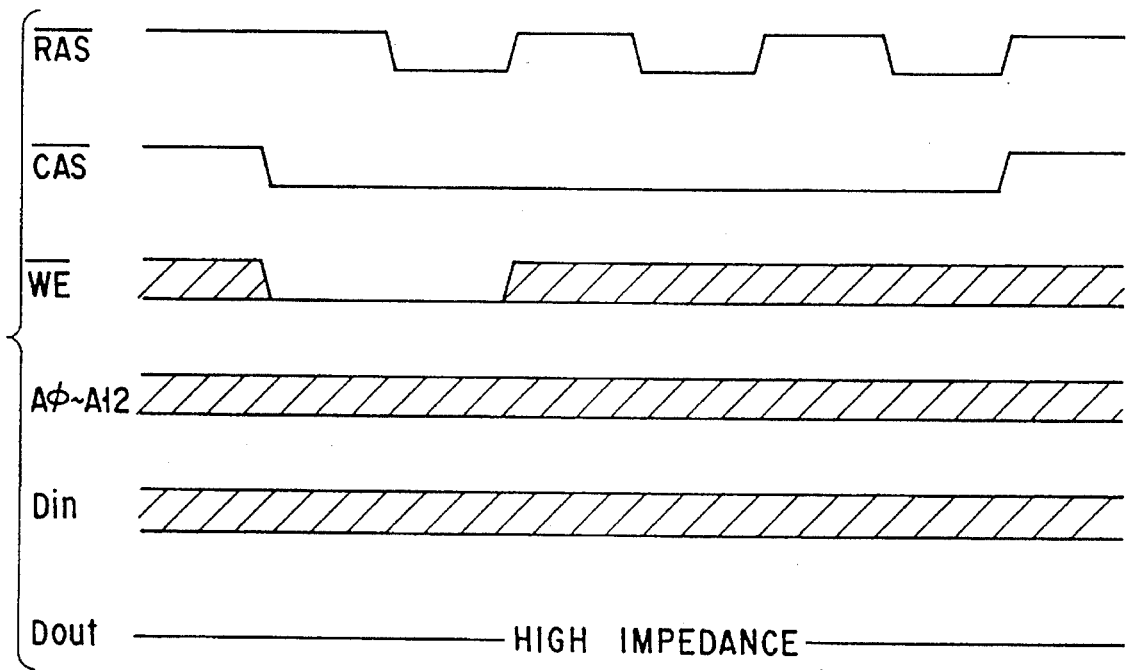
FIG. 4 is a waveform timing chart for an exemplary basic operation of a second embodiment of the invention.

FIG. 4 illustrates an exemplary basic operation of a second embodiment of the invention.

In this second embodiment, the number of times a /RAS signal is made low while a /CAS signal is low since a WCBR cycle has been started is counted to discriminate the special function modes with which it is provided according to the obtained count and select one of the modes in which the memory is entered. FIG. 4 shows a RAS signal which is made low three times.

FIG. 5 illustrates an exemplary basic operation of a third embodiment of the invention.

In this third embodiment, the number of times a /CAS signal is made low while a /RAS signal is low since a WCBR cycle has been started is counted to discriminate the special function modes with which it is provided according to the obtained count and select one of the modes in which the memory is entered. FIG. 5 shows a /CAS signal which is made low three times.

Figure 7:
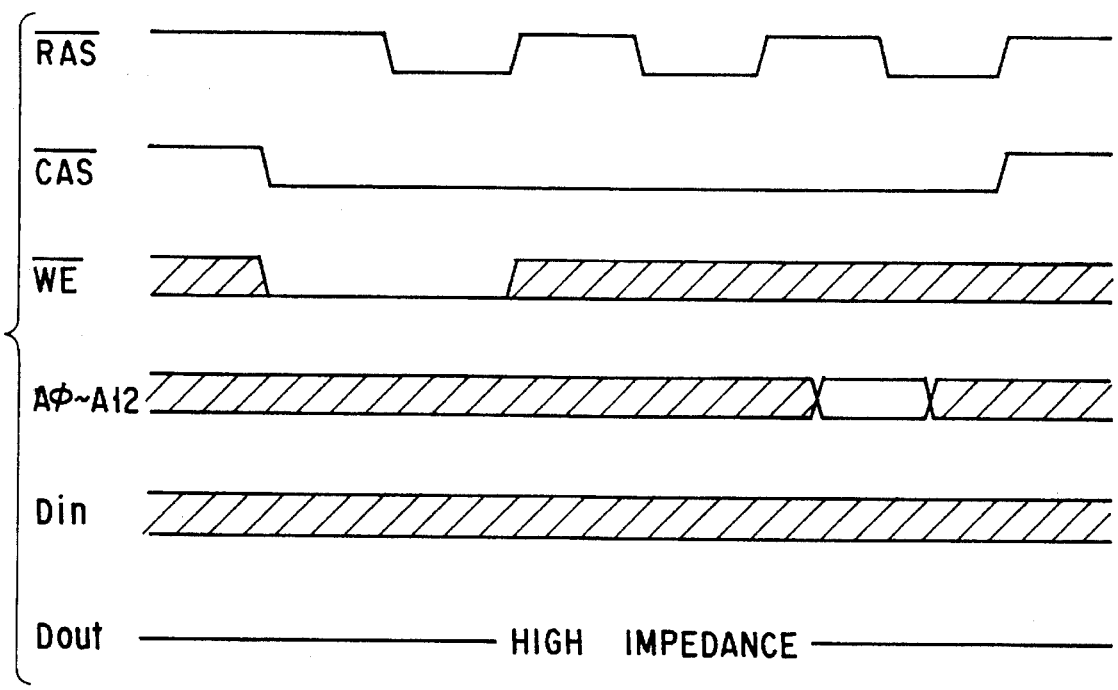
FIG. 7 is a waveform timing chart for an exemplary basic operation of a fifth embodiment of the invention.
Figure 8:
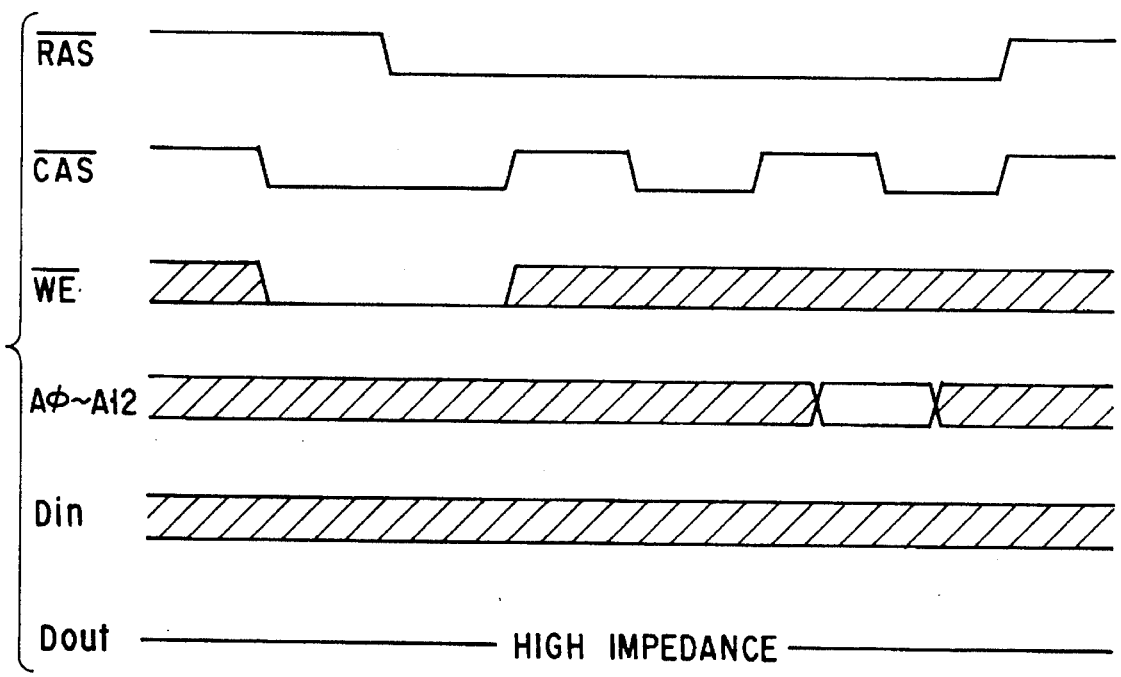
FIG. 8 is a waveform timing chart for an exemplary basic operation of a sixth embodiment of the invention.

Additionally, a memory device according to the present invention may be adapted to meet the requirement of providing a large number of special function modes or discriminating a large number of special function modes by arranging them hierarchically in such a manner that a special function mode has a number of subordinate special function modes by, for instance, expanding the first, second of third embodiment as illustrated in FIGS. 6, 7 or 8 respectively.

FIG. 6 illustrates an exemplary basic operation of a fourth embodiment of the invention.

In this fourth embodiment, the address inputs are checked for reference at the time when a /WE signal is made low for the last time but not for the first time while a /RAS is low since a WCBR cycle has been started to discriminate the special function modes with which it is provided according to the obtained result of the reference check and select one of the modes in which the memory is entered. In other words, each time a different result of reference check is obtained, a different one is selected for memory entry out of the special function modes of a plurality of different types. Since the procedure of selecting a mode for entering the memory there according to the obtained count is same for all the embodiments cited herein, the description thereof will be omitted hereafter.

FIG. 7 illustrates an exemplary basic operation of a fifth embodiment of the invention.

In this fifth embodiment, the address inputs are checked for reference at the time when a /RAS signal is made low for the last time but not for the first time while a /CAS is low since a WCBR cycle has been started to discriminate the special function modes with which it is provided according to the obtained result of the reference check and select one of the modes in which the memory is entered.

FIG. 8 illustrates an exemplary basic operation of a sixth embodiment of the invention.

In this sixth embodiment, the address inputs are checked for reference at the time when a /CAS signal is made low for the last time but not for the first time while a /RAS is low since a WCBR cycle has been started to discriminate the special function modes with which it is provided according to the obtained result of the reference check and select one of the modes in which the memory is entered.

Since the address inputs may be in any state at the start of a WCBR cycle in any of the fourth to sixth embodiments, the conventional WCBR entry method is not subjected to restrictions.

If a DRAM according to the invention is a multiple bit DRAM, the address inputs may be replaced by the I/O (input/output pad) inputs of the memory device for reference (as in the case of the seventh to ninth embodiments described below).

FIG. 9 illustrates an exemplary basic operation of a seventh embodiment of the invention.

In this seventh embodiment, its I/O inputs are checked for reference at the time when a /WE signal is made low for the last time but not for the first time while a /RAS is low since a WCBR cycle has been started to discriminate the special function modes with which it is provided according to the obtained result of the reference check and select one of the modes in which the memory is entered.

FIG. 10 illustrates an exemplary basic operation of an embodiment of the invention.

In this eighth embodiment, its I/O inputs are checked for reference at the time when a /RAS signal is made low for the last time but not for the first time while a /CAS is low since a WCBR cycle has been started to discriminate the special function modes with which it is provided according to the obtained result of the reference check and select one of the modes in which the memory is entered.

FIG. 11 illustrates an exemplary basic operation of a ninth embodiment of the invention.

In this ninth embodiment, its I/O inputs are checked for reference at the time when a /CAS signal is made low for the last time but not for the first time while a /RAS is low since a WCBR cycle has been started to discriminate the special function modes with which it is provided according to the obtained result of the reference check and select one of the modes in which the memory is entered.

While the falling edge of the signal (/WE, /RAS or /CAS) going to a low state for the last time provides the timing for checking the address or I/O inputs for reference in the above embodiments, the rising edge of the /RAS or /CAS signal (that determines the intended last count) going to a high state since the last count may alternatively be used for the timing for checking the address or I/O inputs for reference (as in the case of tenth to fifteenth embodiments described below).

FIG. 12 illustrates an exemplary basic operation of a tenth embodiment of the invention.

In this tenth embodiment, the address inputs are checked for reference at the time when a /RAS signal returns high after a /WE signal has been turned low for the last time but not for the first time while the/RAS has been low since a WCBR cycle was started to discriminate the special function modes with which it is provided according to the obtained result of the reference check and select one of the modes in which the memory is entered.

Figure 13:
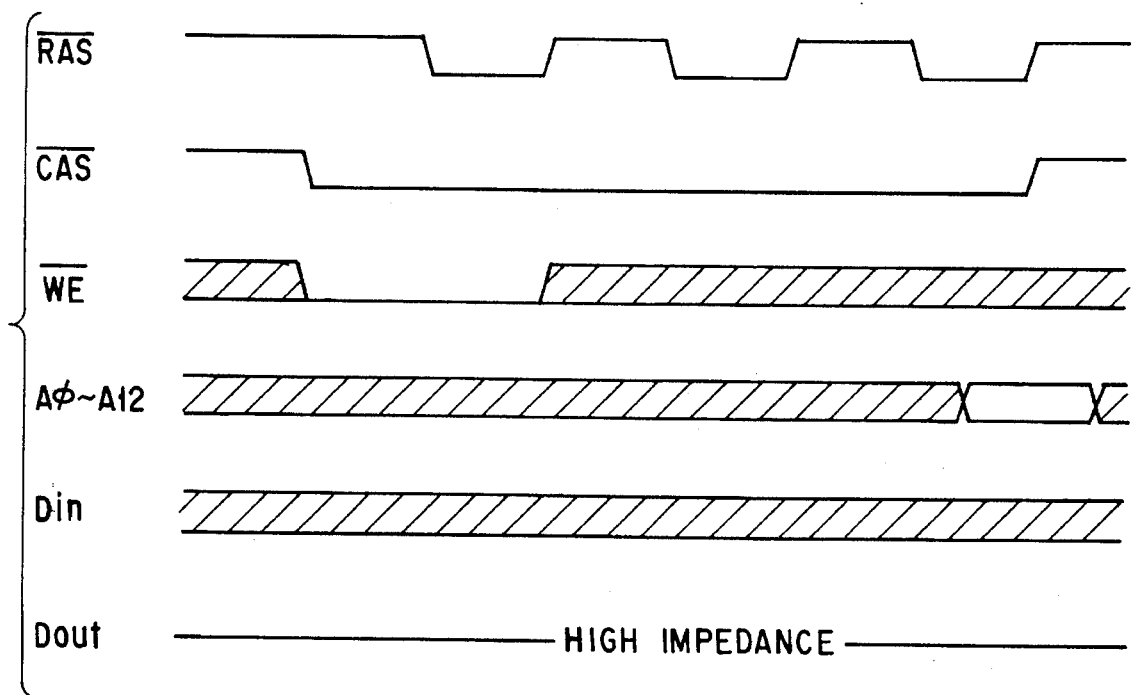
FIG. 13 is a waveform timing chart for an exemplary basic operation of an eleventh embodiment of the invention.

FIG. 13 illustrates an exemplary basic operation of a eleventh embodiment of the invention.

In this eleventh embodiment, the address inputs are checked for reference at the time when a /CAS signal returns high after a /RAS signal has been turned low for the last time but not for the first time while the/CAS has been low since a WCBR cycle was started to discriminate the special function modes with which it is provided according to the obtained result of the reference check and select one of the modes in which the memory is entered.

Figure 14:
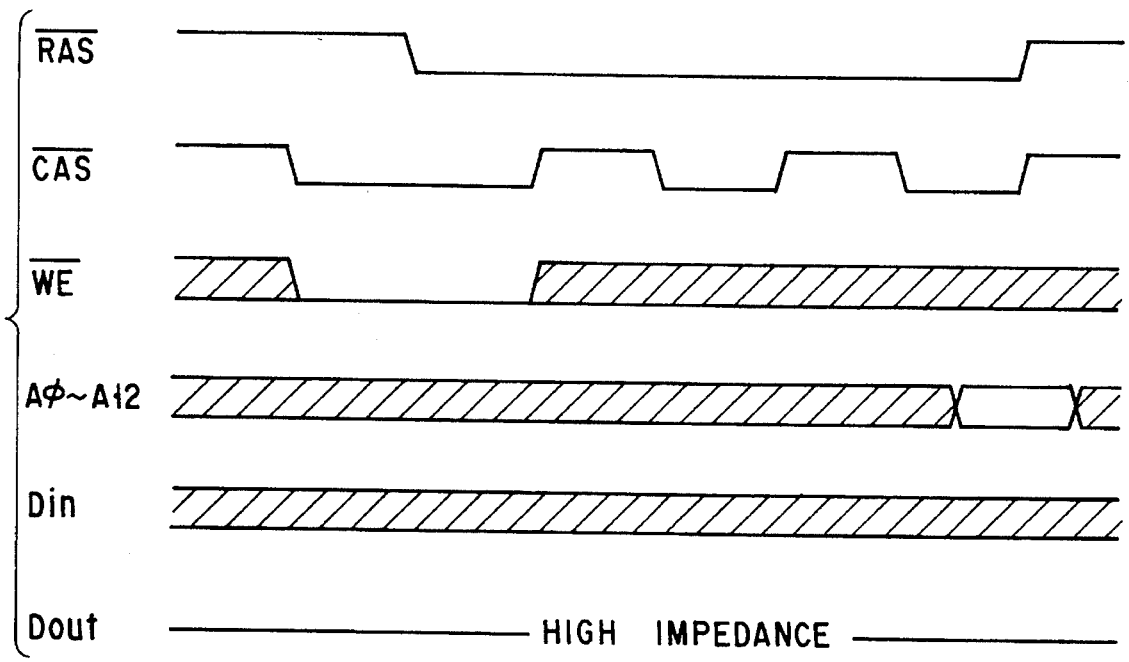
FIG. 14 is a waveform timing chart for an exemplary basic operation of a twelfth embodiment of the invention.

FIG. 14 illustrates an exemplary basic operation of a twelfth embodiment of the invention.

In this twelfth embodiment, the address inputs are checked for reference at the time when a /RAS signal returns high after a /CAS signal has been turned low for the last time but not for the first time while the/RAS has been low since a WCBR cycle was started to discriminate the special function modes with which it is provided according to the obtained result of the reference check and select one of the modes in which the memory is entered.

Figure 15:
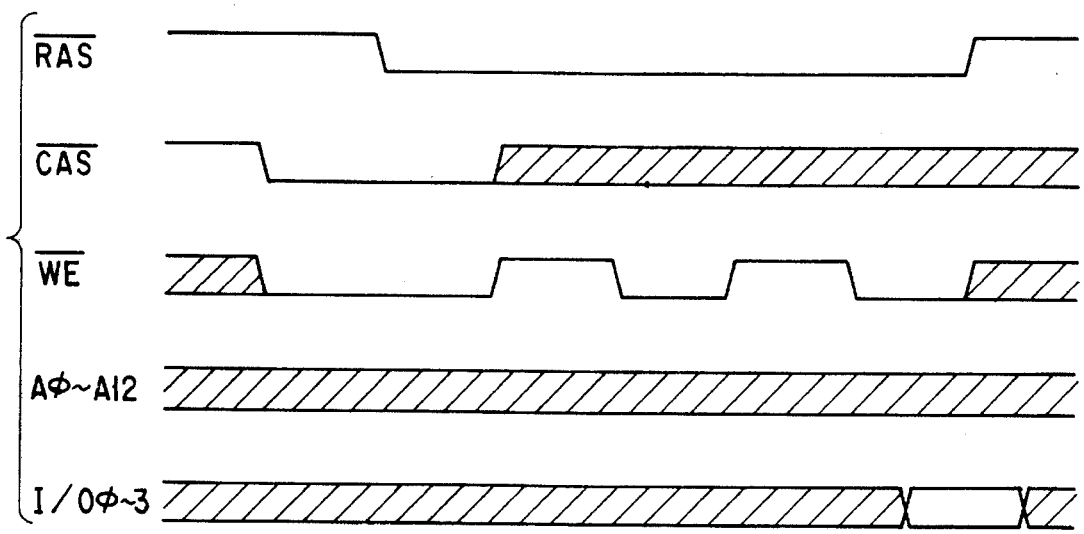
FIG. 15 is a waveform timing chart for an exemplary basic operation of a thirteenth embodiment of the invention.

FIG. 15 illustrates an exemplary basic operation of a thirteenth embodiment of the invention.

In this thirteenth embodiment, the I/O inputs are checked for reference at the time when a /RAS signal returns high after a /WE signal has been turned low for the last time but not for the first time while the/RAS has been low since a WCBR cycle was started to discriminate the special function modes with which it is provided according to the obtained result of the reference check and select one of the modes in which the memory is entered.

Figure 16:
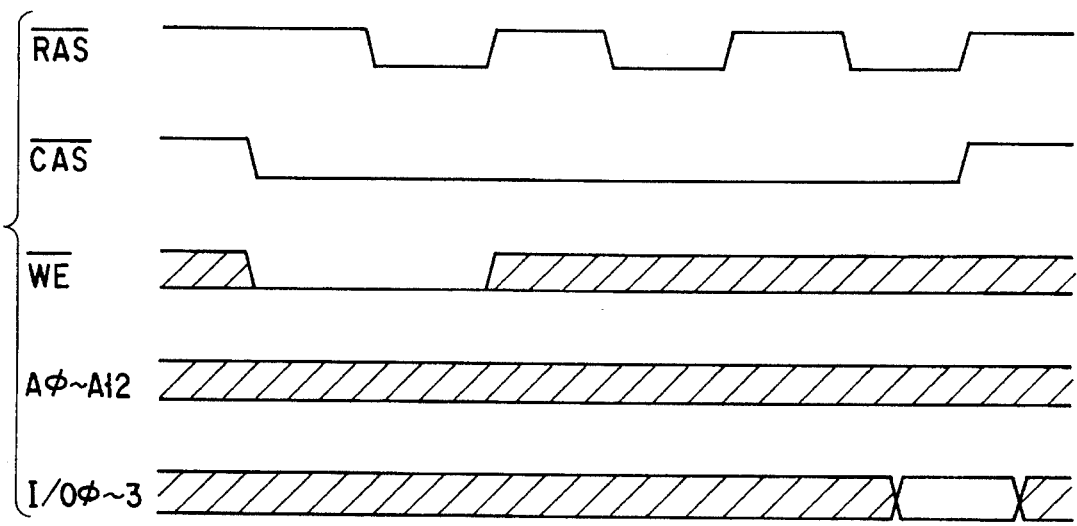
FIG. 16 is a waveform timing chart for an exemplary basic operation of a fourteenth embodiment of the invention.

FIG. 16 illustrates an exemplary basic operation of a fourteenth embodiment of the invention.

In this fourteenth embodiment, the I/O inputs are checked for reference at the time when a /CAS signal returns high after a /RAS signal has been turned low for the last time but not for the first time while the/CAS has been low since a WCBR cycle was started to discriminate the special function modes with which it is provided according to the obtained result of the reference check and select one of the modes in which the memory is entered.

Figure 17:
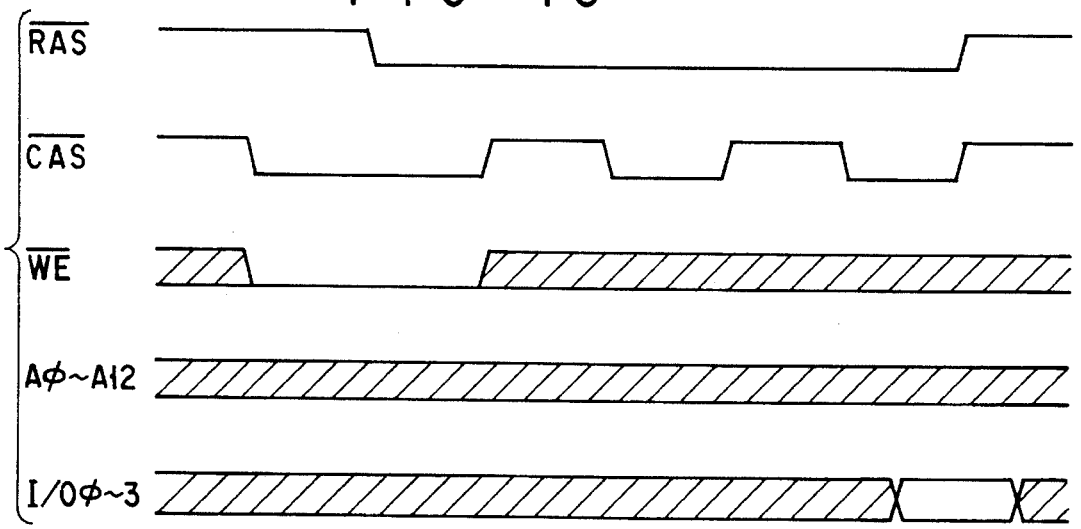
FIG. 17 is a waveform timing chart for an exemplary basic operation of a fifteenth embodiment of the invention.

FIG. 17 illustrates an exemplary basic operation of a fifteenth embodiment of the invention.

In this fifteenth embodiment, the I/O inputs are checked for reference at the time when a /RAS signal returns high after a /CAS signal has been turned low for the last time but not for the first time while the/RAS has been low since a WCBR cycle was started to discriminate the special function modes with which it is provided according to the obtained result of the reference check and select one of the modes in which the memory is entered.

Now, the first embodiment of the invention will be described further in detail.

FIG. 18 is a circuit diagram of a counter circuit that can be used for a DRAM according to the invention.

Figure 19:
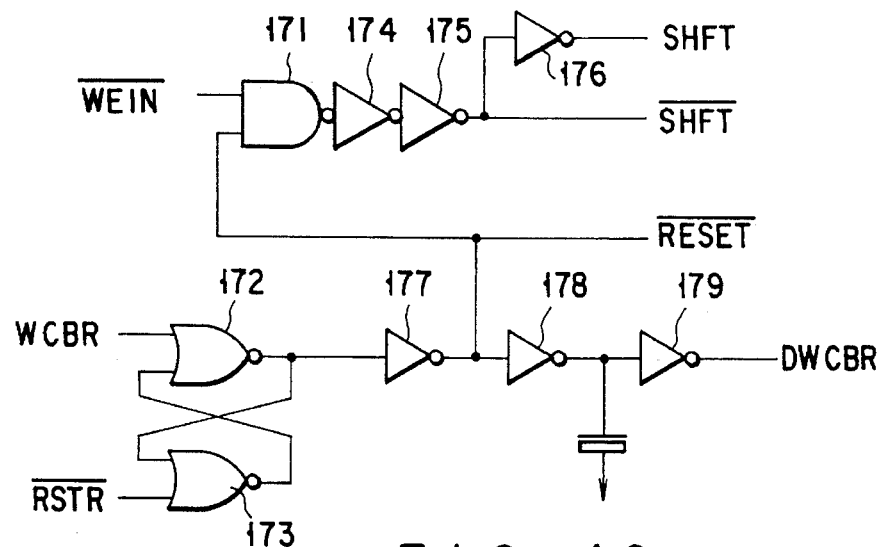
FIG. 19 is a circuit diagram of a counter control circuit that can be used for the first embodiment.

FIG. 19 is a circuit diagram of a counter control circuit that can be used for the first embodiment.

Figure 20:
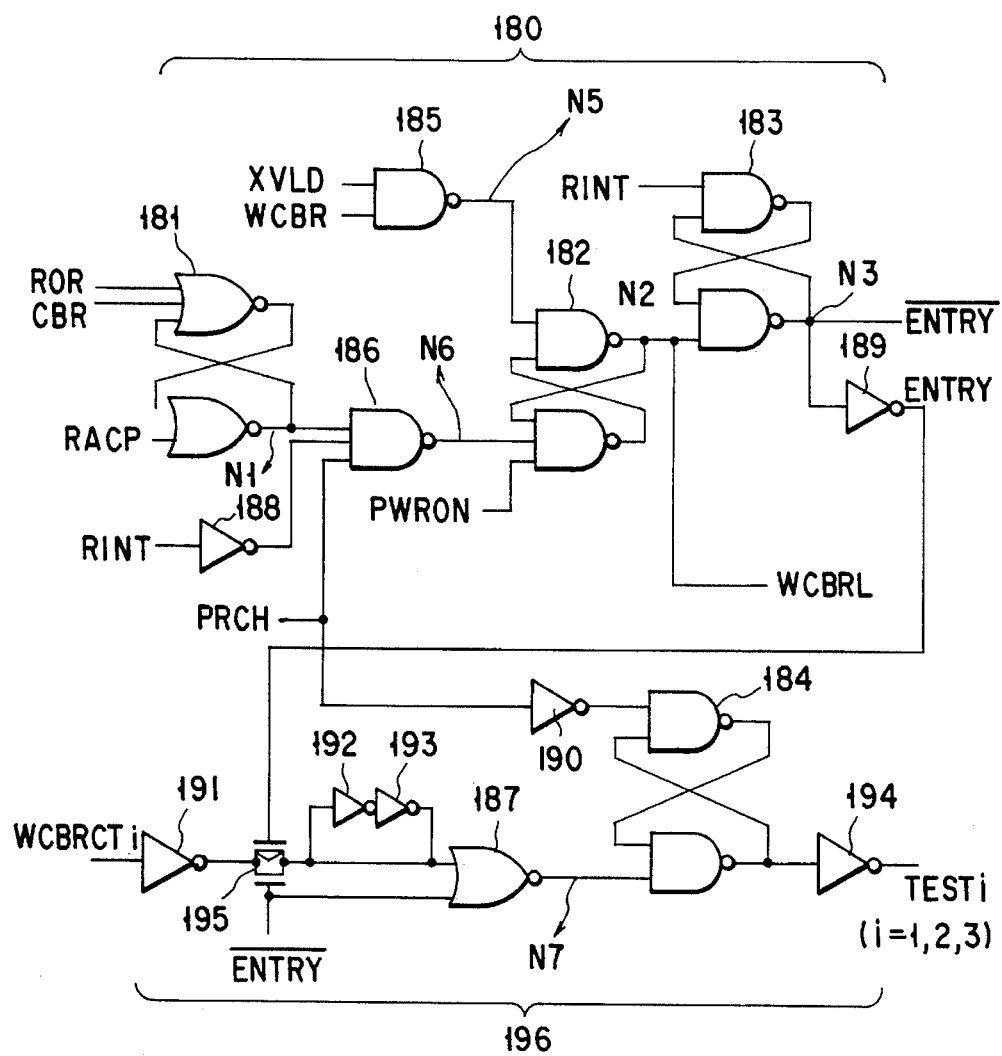
FIG. 20 is a circuit diagram of an entry circuit that can be used for the first embodiment.

FIG. 20 is a circuit diagram of an entry circuit that can be used for the first embodiment.

Figure 21:
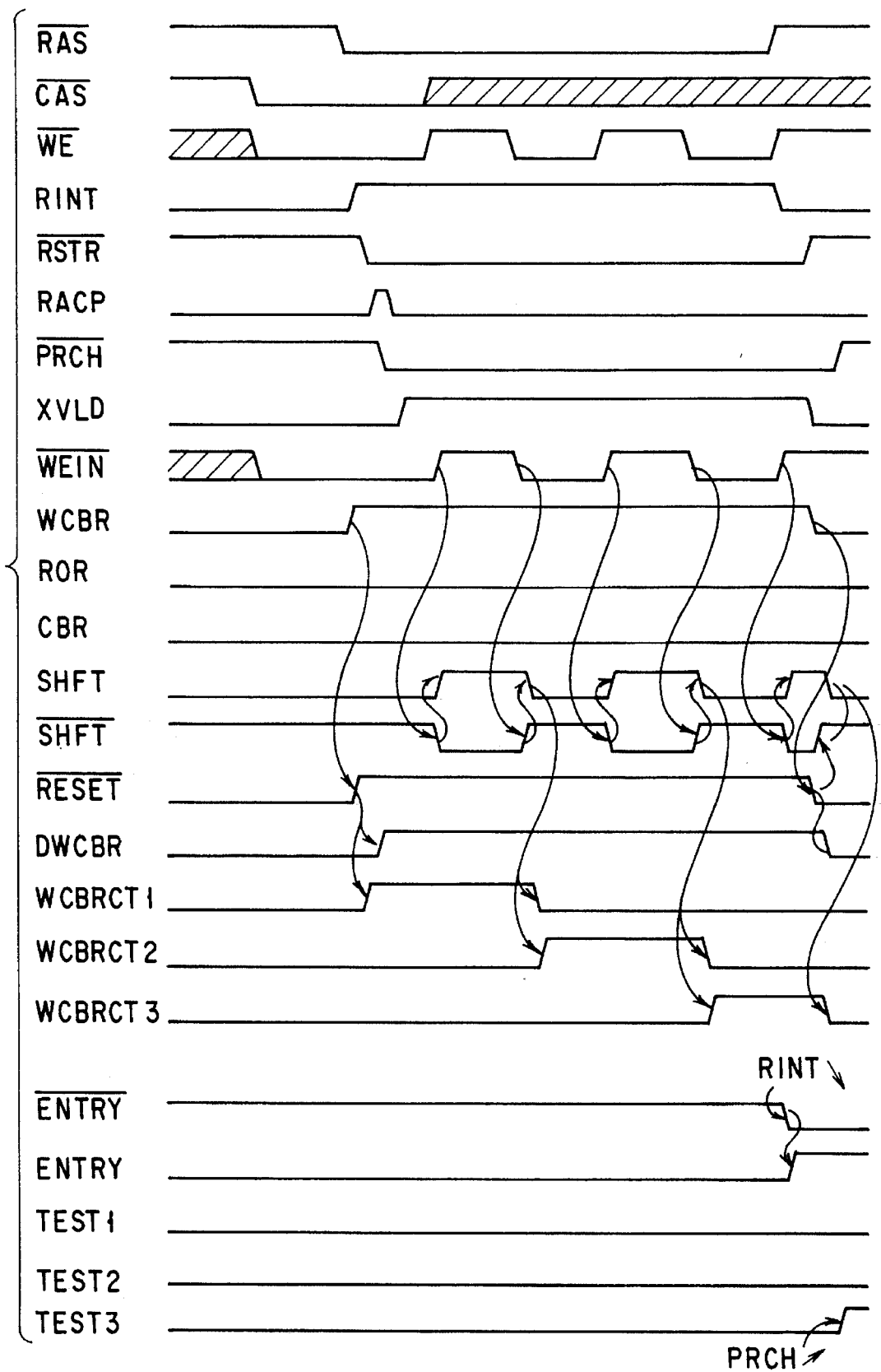
FIG. 21 is a detailed waveform timing chart for an operation of the first embodiment.

FIG. 21 is a detailed waveform timing chart for an operation of the first embodiment (where a /WE signal is counted three times in a low state).

As seen from FIG. 21, the circuit of the first embodiment is so designed that the number of times a /WE signal is made active is counted while a /RAS signal remains active since a WCBR cycle has been started to discriminate the special function modes with which it is provided according to the obtained count and select one of the modes in which the memory is entered. This embodiment comprises a circuit that can discriminate a plurality of (e.g., three) special function modes for memory entry including a test mode conforming to the JEDEC norms or a generally accepted test mode. A circuit that can discriminate four or more than four special function modes may be configured in a similar manner.

Now, the circuits of FIGS. 18 through 20 will be described in greater detail.

The counter circuit illustrated in FIG. 18 operates (or counts the number of times a /WE is made active in the first embodiment) under the control of a counter control circuit by means of control signals and sends out signals WCBRCT1 through WCBRCT3 to an entry circuit.

The counter circuit comprises three master/slave type flip-flop circuits FFs connected with one another to produce a ring-like endless signal passage. Each of the master/slave type flip-flop circuits comprises a CMOS clocked inverter 161 and a flip-flop 162 on the master step and a clocked inverter 163 and a CMOS flip-flop 164 on the slave step.

Referring to FIG. 19 that shows a counter control circuit that can be used for the first embodiment, reference numeral 171 denotes a two-input NAND-gate and reference numerals 172 and 173 denote two-input NOR-gates while reference numerals 174 through 179 denotes respective inverters.

/WEIN denotes an internal write enable signal to be generated by the circuit upon receiving a /WE which is an external signal. A/WEIN signal is practically synchronized with a corresponding /WE signal although it may be slightly delayed.

/RSTR denotes a signal to be generated by the circuit upon receiving a /RAS which is also an external signal. A /RSTR signal is practically synchronized with a corresponding /RAS signal although it may be slightly delayed (particularly when it is made high after the /RAS signal has become high).

WCBR is a signal that becomes high when a WCBR cycle is started and remains high until a /RAS signal is turned back to a high level (non-active level).

SHFT and/SHFT are a pair of basic signals that are complementary to each other and necessary to make the reading of the counter of the counter circuit of FIG. 18 advance. /RESET and DWCBR are signals required to initialize the counter circuit before it is operated.

The circuits of FIGS. 18 and 19 operate in a manner as described below.

When it is determined that the memory has entered a WCBR cycle (because signal /RAS has turned low), signal WCBR goes up to raise signal /RESET that has been in a low level to a high level. Then, signal DWCBR rises with a delay due to a pair of inverter circuits 178, 179 arranged in two steps after the rise of the /RESET.

Under this condition, since signal DWCBR is entered only in input Ai of the first stage (the stage for outputting signal WCBRCT1) while supply voltage Vcc is applied to input Ai's of the other stages, only signal WCBRCT1 rises high whereas the remaining signals WCBRCT2 and WCBRCT3 are held low.

It should be noted here that SHFT is low and /SHFT is high as long as signal /WEIN remains high in the counter control circuit. Thus, since the clocked inverter 161 on the master step is off and the clocked inverter 136 on the slave step is on in every stage of the counter circuit, signal /RESET and input Ai of each stage can be used to transmit signal WCBRCTi without being affected by the output signal of the preceding stage.

When /WE is returned to a high level while /RAS is held to a low level, signals SHFT and /SHFT synchronously become high and low respectively. Thus, in every stage of the counter circuit, the clocked inverter 161 of the master step is turned on whereas the clocked inverter 163 of the slave step is turned off so that signal WCBRCTi in each stage is stored in the corresponding flip-flop 164 of the slave step while signal WCBRCTi of the preceding stage is inverted and transmitted to the flip-flop 162 of the master step.

When /WE is made to go down to a low level once again while /RAS is held to a low level, SHFT and /SHFT synchronously become low and high respectively and consequently, in every stage of the counter circuit, the clocked inverter 161 of the master step and the clocked inverter 163 of the slave step are respectively turned off and on so that the counter circuit is switched to transmit signal WCBRCTi of the preceding stage is successfully transmitted to the succeeding stage in the circuit.

Thus, each time /WE is turned low while /RAS is low, signals WCBRCTi's are sequentially turned high in the order of i=1 to 3 in the counter circuit.

In the circuit diagram of an entry circuit shown in FIG. 20, on the other hand, reference numerals 181 through 184 denote respective flip flops and reference numerals 186 and 185 respectively denote a three-input NAND-gate and a two-input NAND-gate while reference numerals 188–194 denote two-input NOR-gates respective inverter, reference numeral 187 denotes a two-input NOR-gate and reference numeral 195 denotes a CMOS transfer gate.

RINT is a signal obtained by inverting signal /RAS and RACP is a signal for emitting a high level pulse signal immediately after /RAS turns low, while XVLD is a signal that moves from low to high after a row address is determined as /RAS has been turned low.

Signal /PRCH is practically synchronized with /RAS although it shows a slight delay before it turns high after /RAS has returned high.

ROR is a signal that turns high in a cycle where /RAS is turned low while /CAS is held high (which is called a RAS only refresh cycle or simply a ROR cycle). In other words, it is a signal that remains high for a very short period of time from the time when /RAS is returned high to the time when /PRCH returns high.

On the other hand, CBR is a signal that turns high in a cycle where /CAS is turned low before /RAS while /WE is held high (which is called a CAS before RAS cycle or simply a CBR cycle).

PWRON is a power-on signal that is held low for a given period of time after the circuit is energized but turned high before the DRAM actually starts operating and remains high until the circuit is deenergized.

A PWRON signal is necessary to initialize a reset flip-flop that receives it as an input signal to a given state (or turn WCBRL low) and remains high after the initialization so that it does not affect the operation the DRAM.

Reference numeral 180 denotes an ENTRY signal circuit section that generates complementary signals /ENTRY and ENTRY in order to latch a WCBRCTi signal when /RAS is returned high after a WCBR cycle has been started.

Reference numeral 196 denotes a TESTi signal section that latches the state of each WCBRCTi by using signals /ENTRY and ENTRY and outputs TESTi (i=1, 2 and 3) in order to determine which WCBRCTi is turned high in the counter circuit. TESTi is an output signal to discriminate three different test modes and the DRAM enters the i-th test mode when TESTi is high.

The entry circuit having a configuration described above and illustrated in FIG. 20 operates in a manner as described below.

Output node N1 of the flip-flop 181 is low after the normal cycle has been repeated for a number of times and therefore output node N6 of the three-input NAND-gate 186 is high. The output node N5 of the two-input NAND-gate 185 is also high but signal WCBRL on output node N2 of the flip-flop 182 is set low by signal PWRON. If signal WCBR rises under this condition, output node N2 of the flip-flop 182 turns high slightly thereafter when signal XVLD rises. However, signal /ENTRY on output node N3 of the flip-flop 183 and inverted signal ENTRY do not change their respective states as long as signal RINT remains high.

If, in the above operation, output node N2 of the flip-flop 182 is turned high only when WCBR rises, the time at which WCBR rises is close to the time when RINT rises so that, if RINT accidentally turns low after WCBR to the detriment of the operation, /ENTRY instantaneously turns low to lose its proper function.

This is why output node N6 of the flip-flop 183 is turned high after RINT has been securely turned low and the NAND-gate of the flip-flop 183 that receives RINT has been closed in order that output node N2 of the flip-flop 182 is turned high with a slight delay by raising XVLD slightly after WCBR.

Thereafter, the instant /RAS is turned high and therefore RINT is turned low, /ENTRY is moved to a high level. The state of each WCBRCTi when /RAS is returned high is latched by signals /ENTRY and ENTRY and transmitted to output node N7 of the NOR-gate 187.

Under this condition, however, /PRCH and therefore all TESTi (i=1, 2 and 3) still remain low. When /PRCH becomes high after a while, only TESTi that corresponds to WCBRCTi that has been turned high becomes high and the DRAM enters in the corresponding test mode.

Therefore, the time when the memory device enters a test mode is not in an entry cycle but after /RAS is returned to a precharge state after the entry cycle is over. With such an arrangement, any inadequate operation of mode switching in the DRAM while it is being moved into an active state can be effectively eliminated so that data may be protected against destruction in the DRAM.

Note that both /ENTRY and ENTRY return to their respective original states when an ROR or CBR refresh cycle comes.

Now, the other embodiments of the invention will be described below. Since logic circuits as illustrated in FIGS.

18 through 20 are also used in these embodiments, they are indicated by the same reference symbols and will not be described any further.

Firstly, the second embodiment of the invention will be described in detail.

In this second embodiment, a counter circuit as illustrated in FIG. 18 is also used.

FIG. 22 is a circuit diagram of a counter control circuit that can be used for the second embodiment.

FIG. 23 is a circuit diagram of an entry circuit that can be used for the second embodiment.

Figure 24:
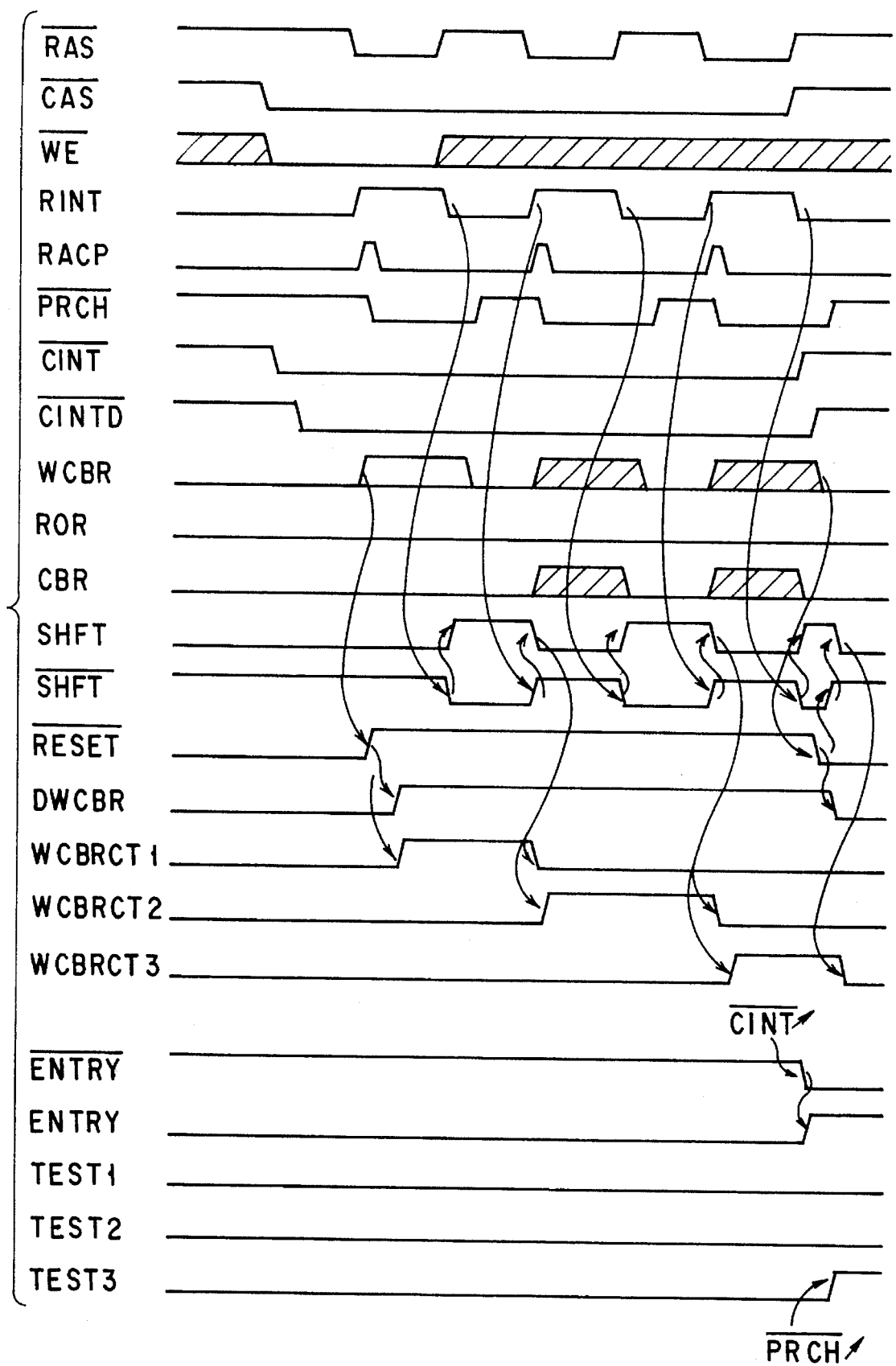
FIG. 24 is a detailed waveform timing chart for an operation of the second embodiment.

FIG. 24 is a detailed waveform timing chart for an operation of the second embodiment.

The counter control circuit of FIG. 22 differs from that of FIG. 19 designed for the first embodiment in that signal /WEIN is replaced by signal RINT to generate basic signals SHFT, /SHFT for the counter circuit and signal /CINTD is used in place of signal /RSTR to reset DWCBR. /CINTD is a signal delayed by an appropriate length of time from signal /CINT which is synchronized with signal /CAS.

The entry circuit shown in FIG. 23 differs from that of FIG. 20 designed for the first embodiment in that signal /RINT is replaced by signal /CINT to determine the state of ENTRY (so that consequently signal XVLD is made unnecessary) and only signal ROR is used to cancel WCBR (so that signal CBR is not used) and that signal TESTi is turned high when both /CINTD and /PRCH become high.

Since the operation of the second embodiment is basically the same as that of the first embodiment, it will not be described here any further. However, special attention should be paid to the fact that signal CBR is not used to cancel WCBR.

This is because /WE may be in any state and hence a CBR cycle may brought into effect at or after the second count of an active signal.

The third embodiment of the invention will be described in detail.

A counter circuit shown in FIG. 18 and an entry circuit shown in FIG. 20 can be used for the third embodiment.

Figure 25:
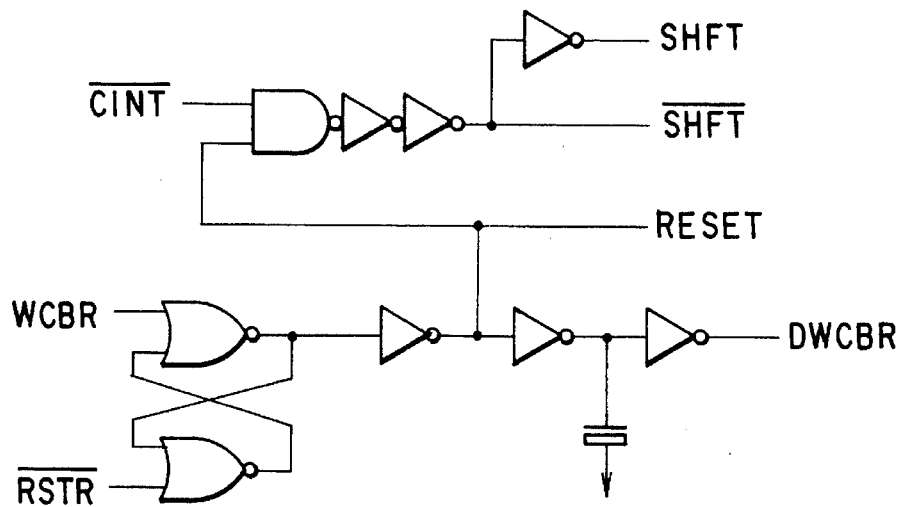
FIG. 25 is a circuit diagram of a counter control circuit that can be used for the third embodiment.

FIG. 25 illustrates a circuit diagram of a counter control circuit that can be used for the third embodiment.

The counter control circuit of FIG. 25 differs from that of FIG. 19 designed for the first embodiment in that signal /CINT is used in place of signal /WEIN to generate basic signals SHFT, /SHFT for the counter circuit.

The operation of the third embodiment is basically the same as that of the first embodiment and therefore the waveform timing chart of FIG. 21 can be applied to the third embodiment by simply replacing /WEIN with /CINT in the drawing.

The fourth embodiment of the invention will be described in detail below.

A counter circuit shown in FIG. 18 and a counter control circuit shown in FIG. 21 can be used for the fourth embodiment.

Figure 26:
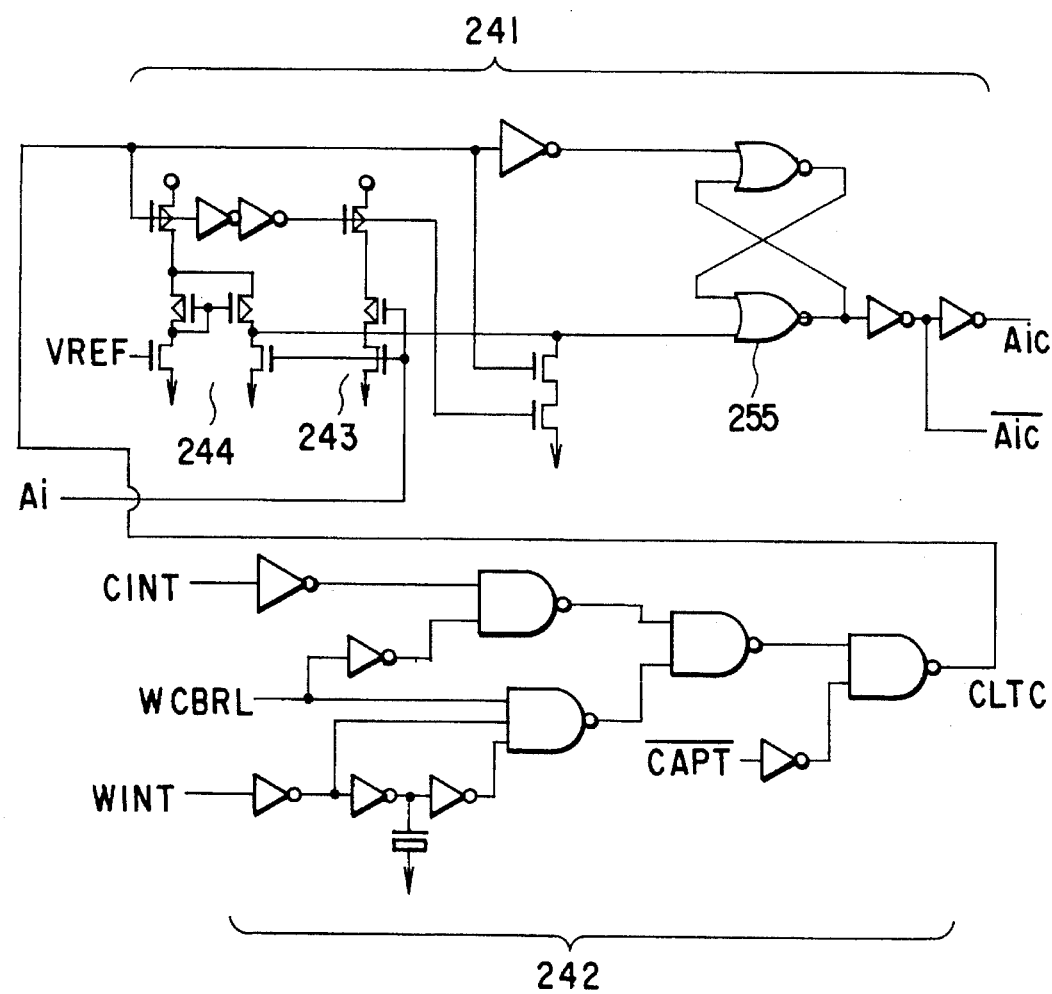
FIG. 26 is a circuit diagram of a column address buffer and a control circuit thereof that can be used for the fourth embodiment.

FIG. 26 is a circuit diagram of a column address buffer and a control circuit thereof that can be used for the fourth embodiment.

FIG. 27A is a circuit diagram of a TESTij generation circuit of an entry circuit and FIG. 27B is a truth table thereof that can be used for the fourth embodiment.

Figure 28:
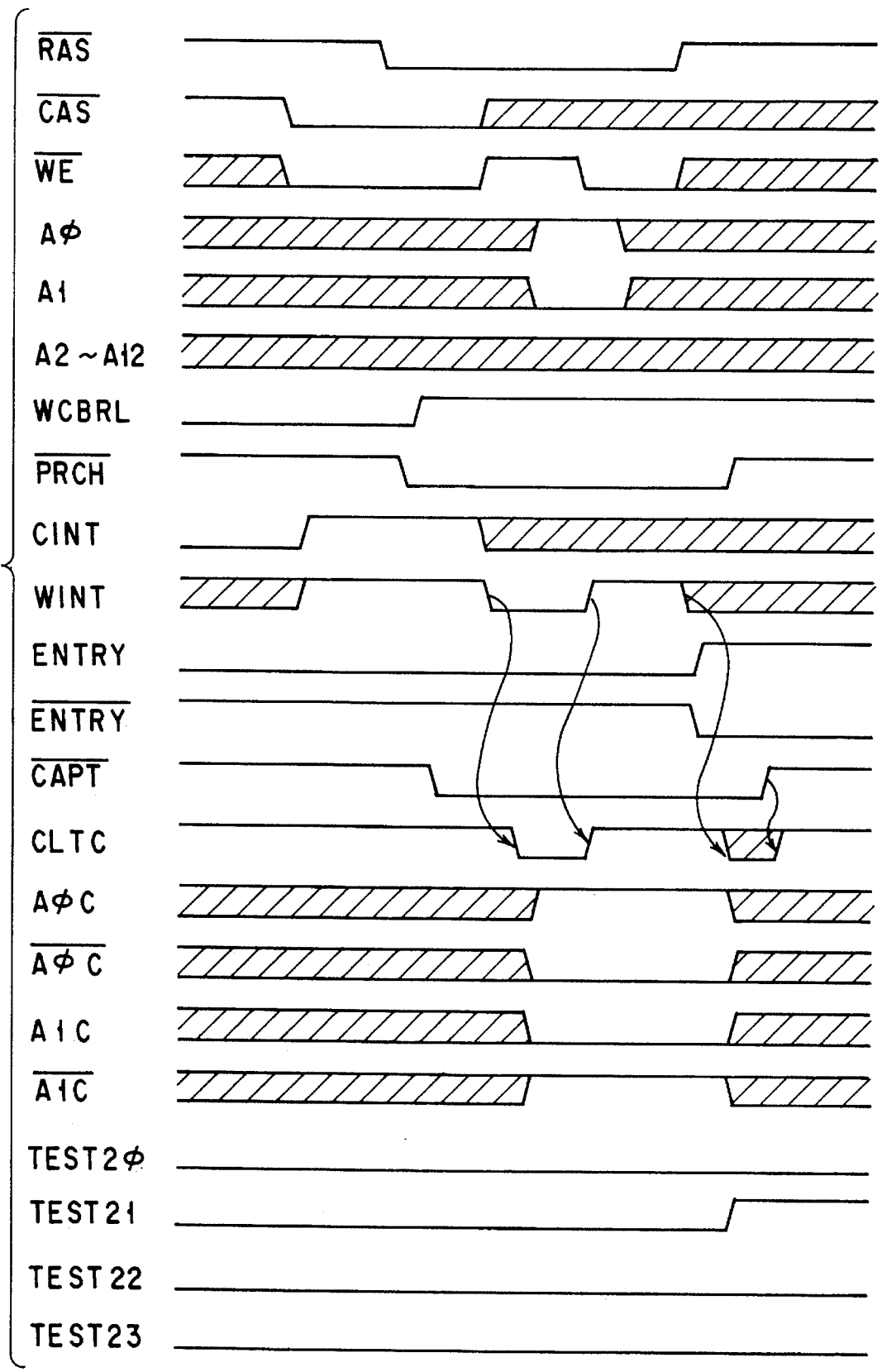
FIG. 28 is a detailed waveform timing chart for an operation of the fourth embodiment.

FIG. 28 is a detailed waveform timing chart for an operation of the fourth embodiment (where a /WE signal is counted twice in a low state).

This fourth embodiment is so designed that, when it enters a WCBR cycle, either the row address buffer (RAB) or the column address buffer (CAB) is made to operate synchronously with /WE to latch an address signal at a falling edge of /WE and that when, it enters the cycle synchronously with a rising motion of /RAS, it checks the latched address for reference to discriminate the special function modes with which it is provided so that it may be entered in a selected one of them. In FIG. 28, it will be seen that an address is also latched at a falling edge of /CAS.

It will be seen from FIG. 26 illustrating a CAB 241 and a control circuit 242 for the CAB that the former has a conventional circuit configuration.

The CAB 241 is so designed that, when control signal CLTC is at a low level, it determines if address Ai is high or low by means of a parallel-connected circuit comprising an inverter circuit 243 and a current mirror circuit 244 and, the instant the CLTC goes high, it latches corresponding data for Ai to flip flop 255 to output internal addresses AiC, /AiC.

When signal WCBRL generated in the ENTRY signal generating circuit 180 of FIG. 20 is low, or in a cycle other than a WCBR cycle, CLTC generating circuit 242 is controlled only by signal CINT (signal obtained by inverting /CAS) to latch a column address by means of /CAS in an ordinary manner and then enter the DRAM in a WCBR cycle. When WCBR goes high, CLTC comes to be controlled by signal WINT.

The TESTij generating circuit illustrated in FIG. 27A is obtained by modifying the TESTij generating circuit 181 of FIG. 20 so that it enters the DRAM in a test mode upon receiving column address signals A0C, /A0C, A1C, /A1C.

While this embodiment checks only two addresses A0C and A1C for reference or, in other words, four different i-th test modes may alternatively be used in this embodiment, a DRAM according to the invention can discriminate a total of m×2n test modes for entry if the counter circuit can count up to m and the number of addresses to be checked for reference is n.

It should be noted here that /WE needs to be held low until /RAS goes high and CLTC needs to go low with an appropriate delay after a rising edge of WINT as seen in FIG. 26 because an ENTRY signal is generated at a rising edge of /RAS to latch the current count and address.

The fifth embodiment of the invention will be described in detail below.

A counter circuit shown in FIG. 18 and a counter control circuit shown in FIG. 19 can be used for the fifth embodiment.

FIG. 29 is a circuit diagram of a row address buffer that can be used for the fifth embodiment.

FIG. 30 is a circuit diagram of a control circuit of the row address buffer of FIG. 29.

FIG. 31A is a circuit diagram of a TESTij generation circuit of an entry circuit and FIG. 31B is a truth table thereof that can be used for the fifth embodiment.

Figure 32:
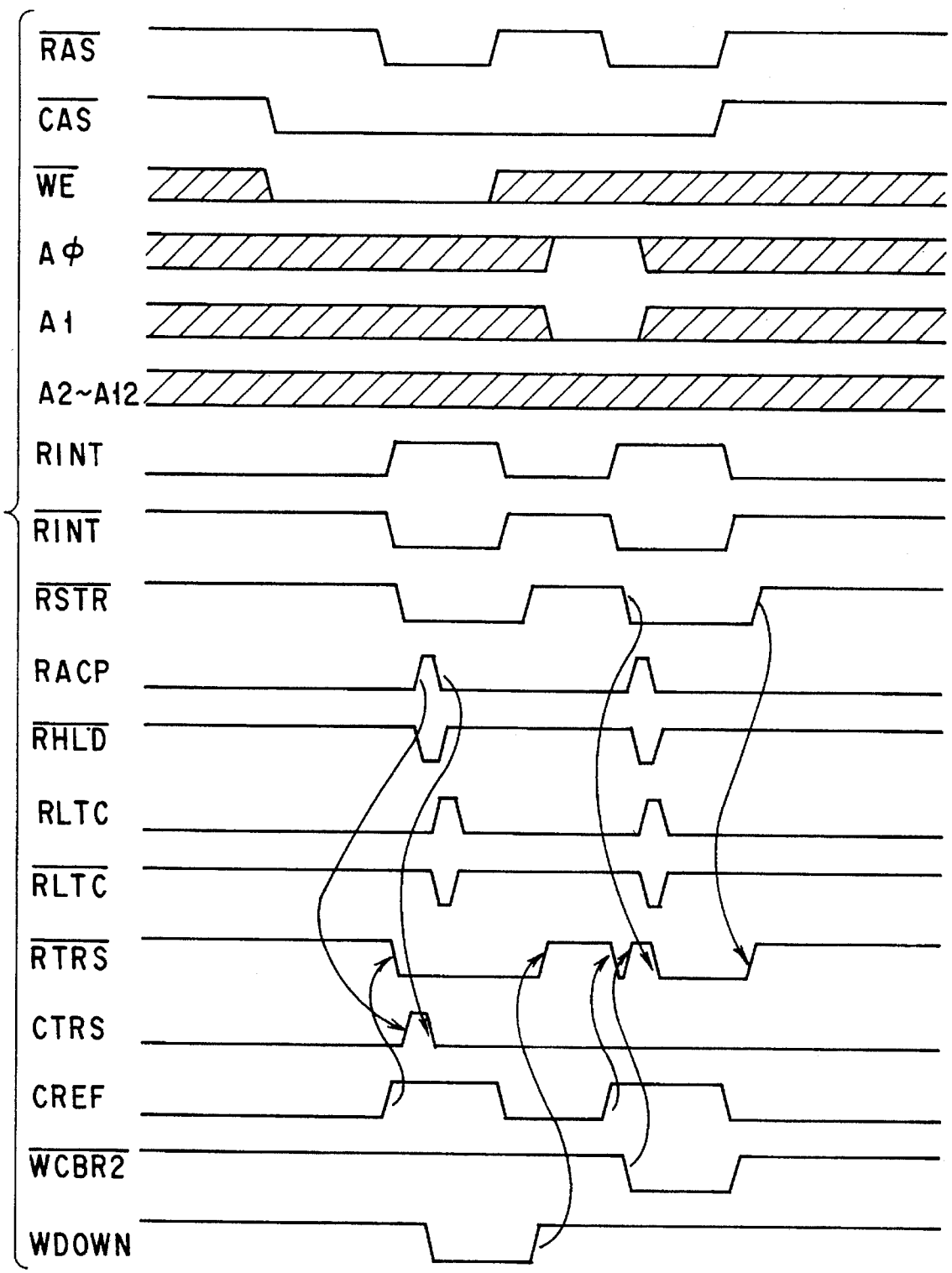
FIG. 32 is part of a detailed waveform timing chart for an operation of the fifth embodiment.

FIG. 32 is part of a detailed waveform timing chart for an operation of the fifth embodiment (where a /RAS signal is counted twice).

Figure 33:
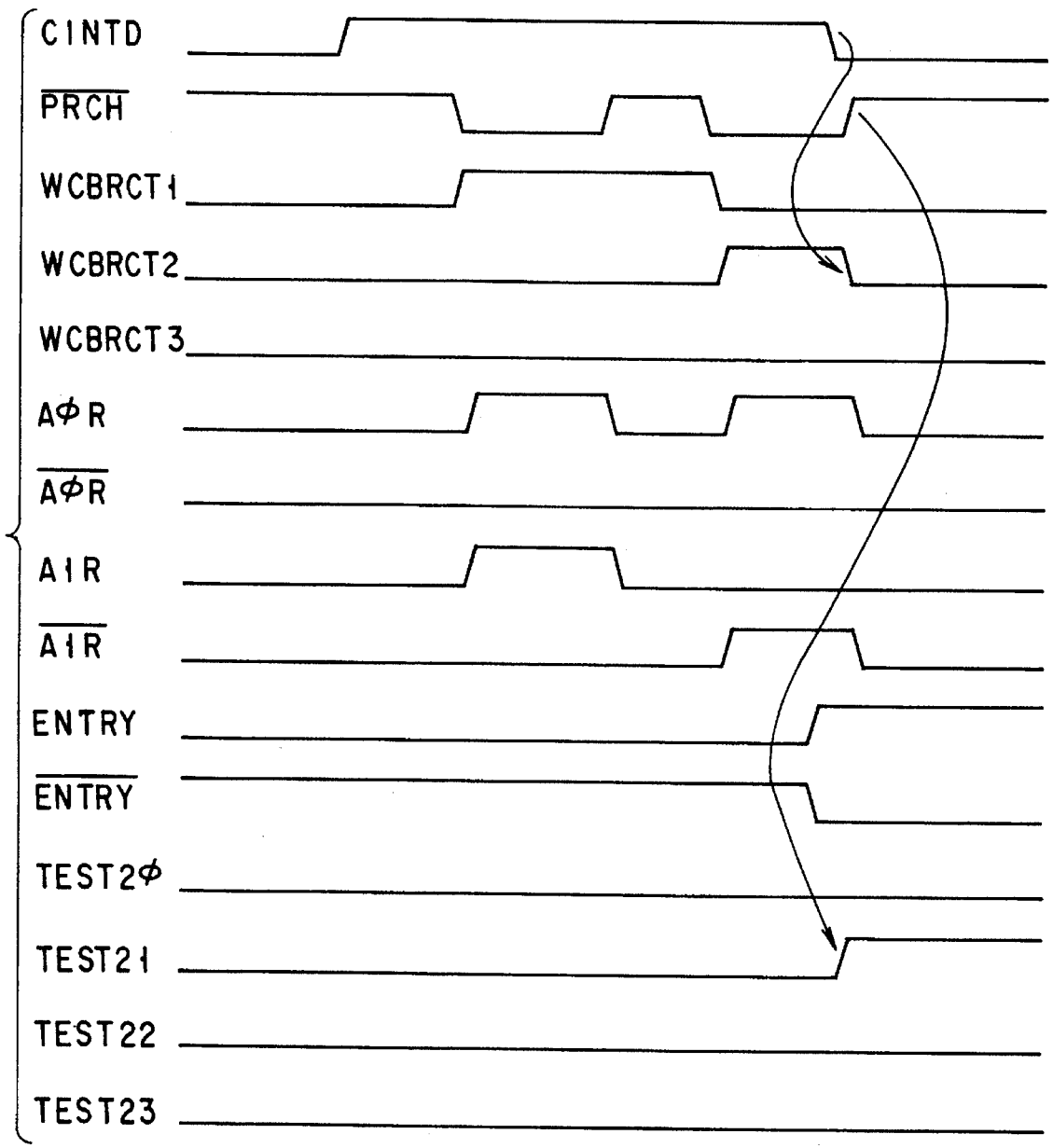
FIG. 33 is the remaining part of the detailed waveform timing chart of FIG. 32.

FIG. 33 is the remaining part of the detailed waveform timing chart of FIG. 32.

This fifth embodiment is so designed that, when it enters a WCBR cycle, either the RAB or the CAB is made to operate synchronously with /WE to latch an address signal at a falling edge of /RAS and that when, it enters the cycle synchronously with a rising motion of /CAS, it checks the latched address for reference to discriminate the special function modes with which it is provided so that it may be entered in a selected one of them. In FIG. 32, it will be seen that an address is also latched at a falling edge of /RAS.

Since a RAB is designed in such a way that it latches an address synchronously with a falling edge of RAS and resets both internal row addresses AiR, /AiR to a low level after ensuring that /RAS goes high and the word line goes low, a conventional RAB and a RAB control circuit can be used for the purpose of the present invention without modifying them.

However, the first time /RAS is counted, the address of the row address counter needs to be taken in for automatic refresh whereas an external address needs to be taken in as a row address without using the row address counter for the second and succeeding counts.

It is also possible not to urge the word line to go high for the second and succeeding counts of /RAS. Although it is not a mandatory requirement, it is preferable not to urge the word line to go high and amplify data in order to achieve a short counting cycle.

In the RAB control circuit of FIG. 30, WDOWN is a signal that goes high after the word line goes low and CREF is a signal that goes high immediately after a rise of RINT in a CBR or WCBR cycle.

The sixth embodiment of the invention will be described in detail below.

A counter circuit shown in FIG. 18, a counter control circuit shown in FIG. 19 and a TESTij generating circuit of an entry circuit illustrated in FIG. 27 can be used for the sixth embodiment.

FIG. 34 is a circuit diagram of a CAB that can be used for the sixth embodiment.

FIG. 35 is a detailed waveform timing chart for an operation of the sixth embodiment.

This sixth embodiment is so designed that, when it enters a WCBR cycle, either the RAB or the CAB is made to operate synchronously with /WE to latch an address signal at a falling edge of /WE and that, as it enters the cycle synchronously with a rising motion of /RAS, it checks the latched address for reference to discriminate the special function modes with which it is provided so that it may be entered in a selected one of them. In FIG. 32, it will be seen that an address is also latched at a falling edge of /RAS.

Since a CAB is designed in such a way that it latches an address synchronously with a falling edge of /CAS and cancel the address latch operation at a rising edge of /CAS to statically take in external address Ai as internal column addresses AiC, /AiC without altering it, a conventional CAB and a CAB control circuit can be used for the purpose of the present invention without modifying them.

However, it should be noted that /CAS needs to be held low until a rising edge of /RAS and a rising edge of /CAS (or CINT) needs to be followed by a rising edge of CLTC with an appropriate delay in order that the number of times with which /CAS is applied to a toggle and the current address at the time of the final falling edge of /CAS are latched immediately after a rising edge of /CAS.

The seventh embodiment of the invention will be described in detail below.

A counter circuit shown in FIG. 18 and a counter control circuit shown in FIG. 19 can be used for the seventh embodiment.

FIG. 36 is a circuit diagram of a data input buffer circuit that can be used for the seventh embodiment.

FIG. 37 is a circuit diagram of a control circuit of the buffer circuit of FIG. 36.

FIG. 38 is a circuit diagram of a TESTij generation circuit of an entry circuit and a truth table thereof that can be used for the seventh embodiment.

Figure 39:
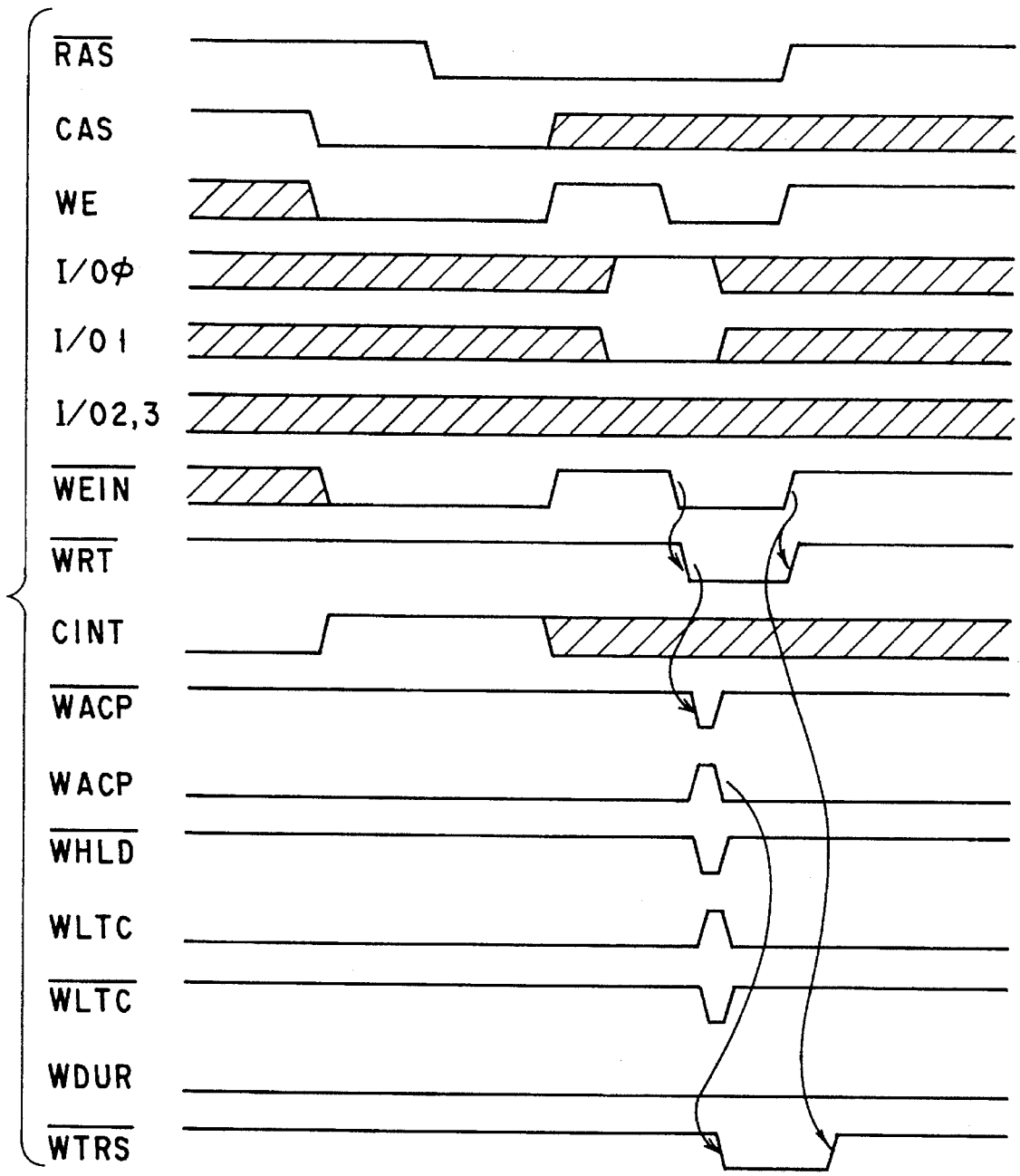
FIG. 39 is part of a detailed waveform timing chart for an operation of the seventh embodiment.

FIGS. 39 and 40 show a detailed waveform timing chart for an operation of the seventh embodiment.

The data input buffer circuit of FIG. 36 and the data input buffer control circuit of FIG. 37 are so designed that the data input buffer circuit can be operated by starting signal /WRT by means of signal WEIN which is synchronized with /WE.

Since the operation of the data input buffer of this seventh embodiment with which the data on an I/O pad is latched at a rising edge of /WE is the same as that of a conventional write data input buffer (Din buffer), a conventional buffer may be used for the purpose of the present invention without modifying it.

However, in the normal course of operation of a conventional write data input buffer, a data write period (during which signal WDUR in FIG. 37 is held high) is automatically defined within the DRAM by its write time out feature to reset complementary internal I/O data (WDi, /WDi) regardless of the state of /WE (even if it remains low). Contrary to this, since the count of /WE and the current I/O data at the final rising edge of /WE need to be latched by signal ENTRY in an entry cycle of the above embodiment, signal WDUR in FIG. 37 is held low during a WCBR cycle.

The eighth embodiment of the invention will be described in detail below.

Figure 41:
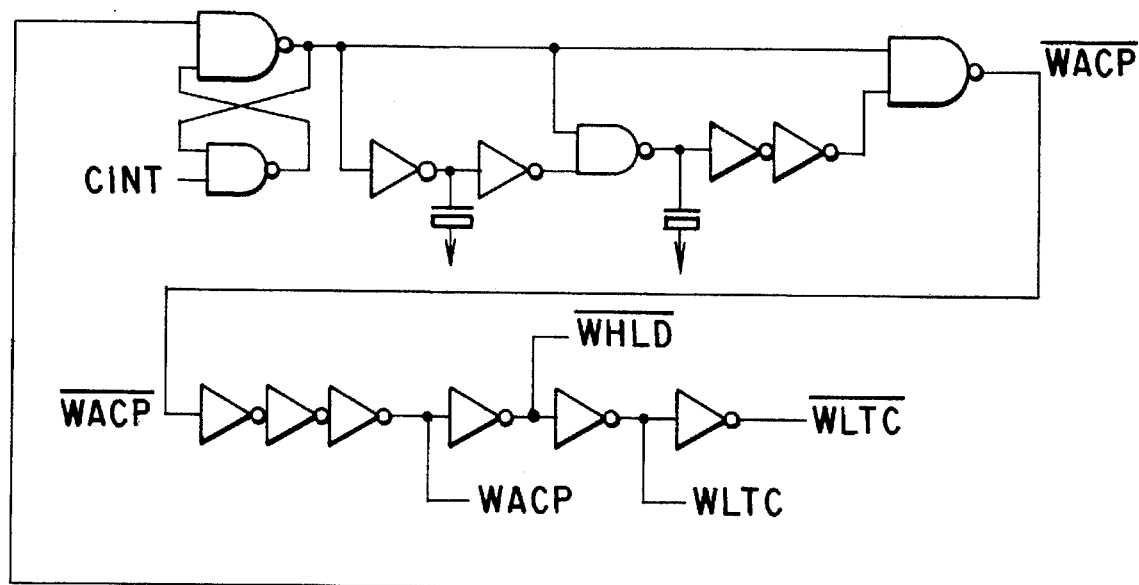
FIG. 41 is a circuit diagram of a data input buffer control circuit that can be used for the eighth embodiment.
Figure 41:
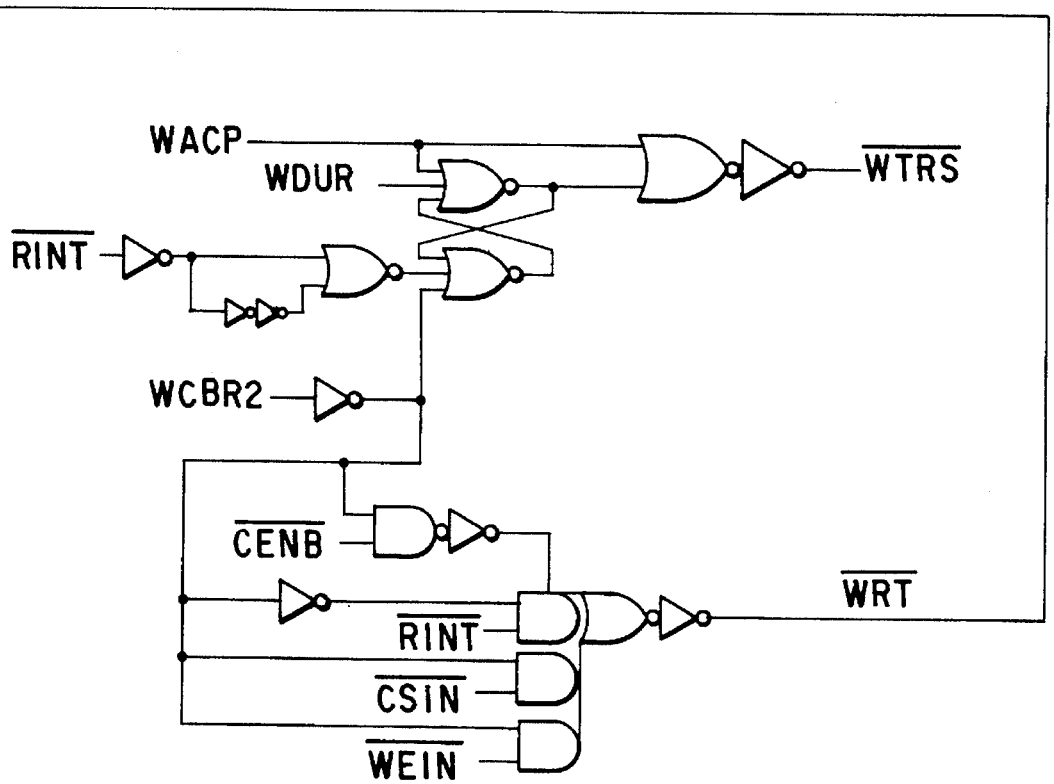

FIG. 41 is a circuit diagram of an input buffer control circuit that can be used for the eighth embodiment.

The eighth embodiment is obtained by partly modifying the input buffer control circuit of the seventh embodiment as shown in FIG. 41, while the remaining portions are identical with their counterparts of the seventh embodiment.

The operation of the eighth embodiment differs from that of the seventh embodiment only in that the data input buffer circuit is operated by starting signal /WRT by means of signal /RINT which is synchronized with /RAS.

Figure 42:
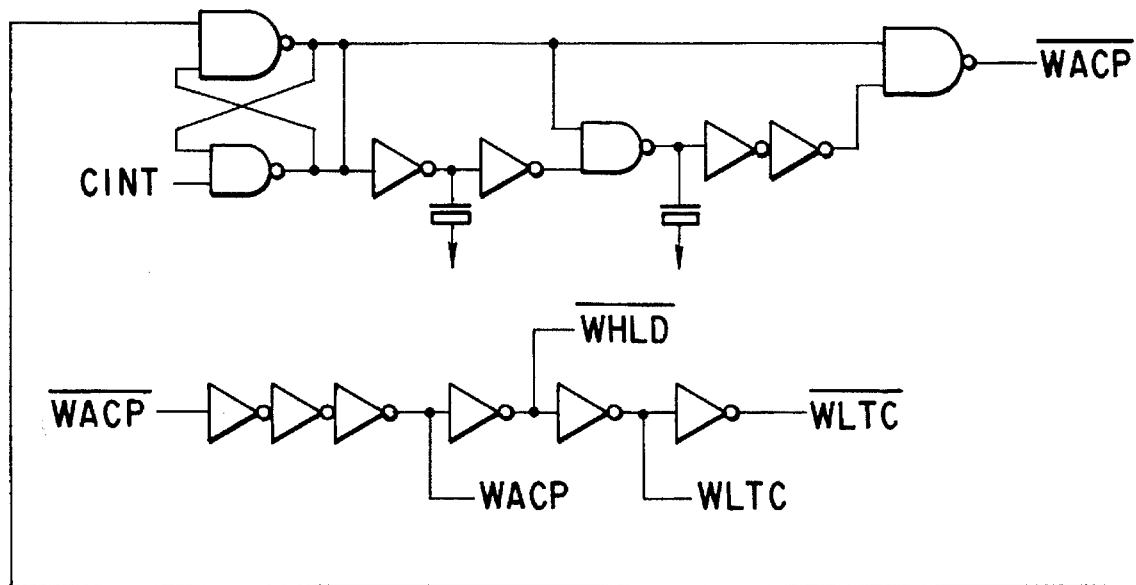
FIG. 42 is a circuit diagram of a data input buffer control circuit that can be used for the ninth embodiment.
Figure 42:
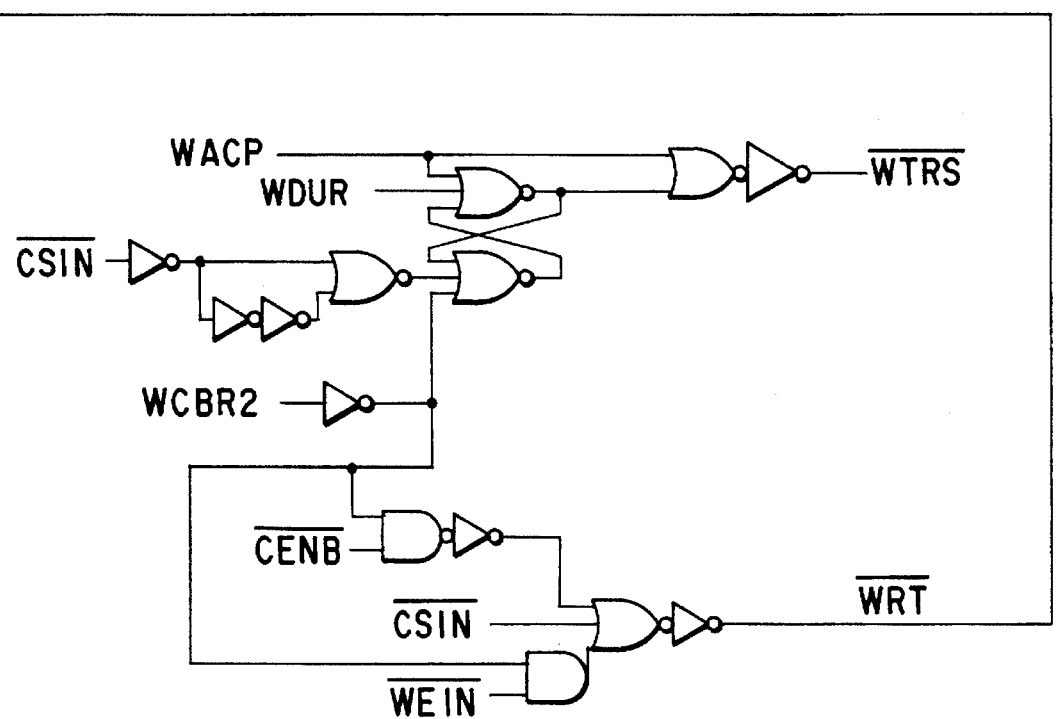

The ninth embodiment of the invention will be described in detail below. FIG. 42 is a circuit diagram of an input buffer control circuit that can be used for the ninth embodiment.

The ninth embodiment is obtained by partly modifying the input buffer control circuit of the seventh embodiment as shown in FIG. 42, while the remaining portions are identical with their counterparts of the seventh embodiment.

The operation of the ninth embodiment differs from that of the seventh embodiment only in that the data input buffer circuit is operated by starting signal /WRT by means of signal /CSIN which is synchronized with /CAS.

The tenth embodiment of the invention will be described in detail below.

A counter circuit shown in FIG. 18, a counter control circuit shown in FIG. 19 and a TESTij generating circuit of an entry circuit illustrated in FIG. 27 can be used for the sixth embodiment.

Figure 43:
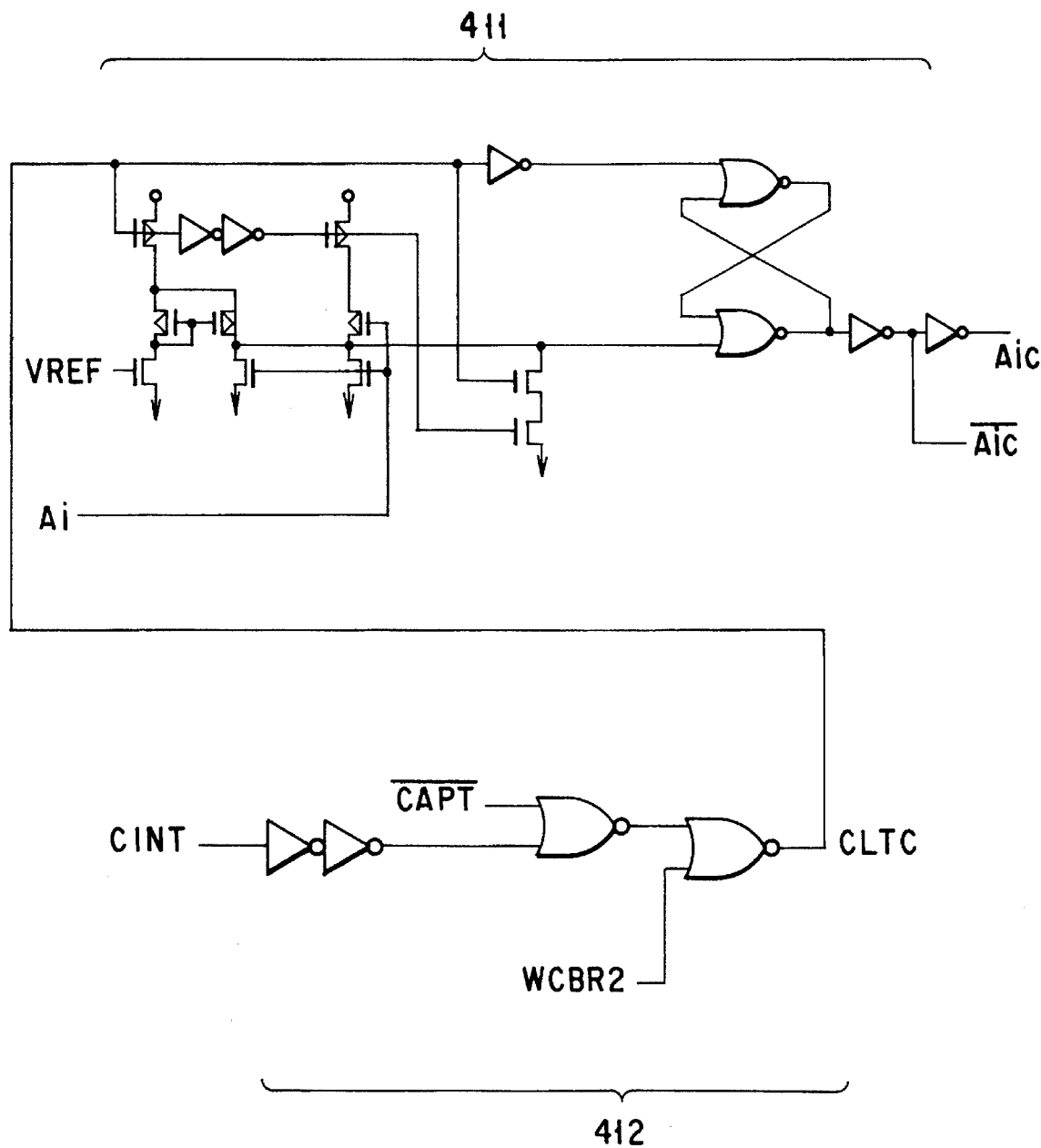
FIG. 43 is a circuit diagram of a column address buffer that can be used for the tenth embodiment.

FIG. 43 is a circuit diagram of a CAB that can be used for the tenth embodiment.

Figure 44:
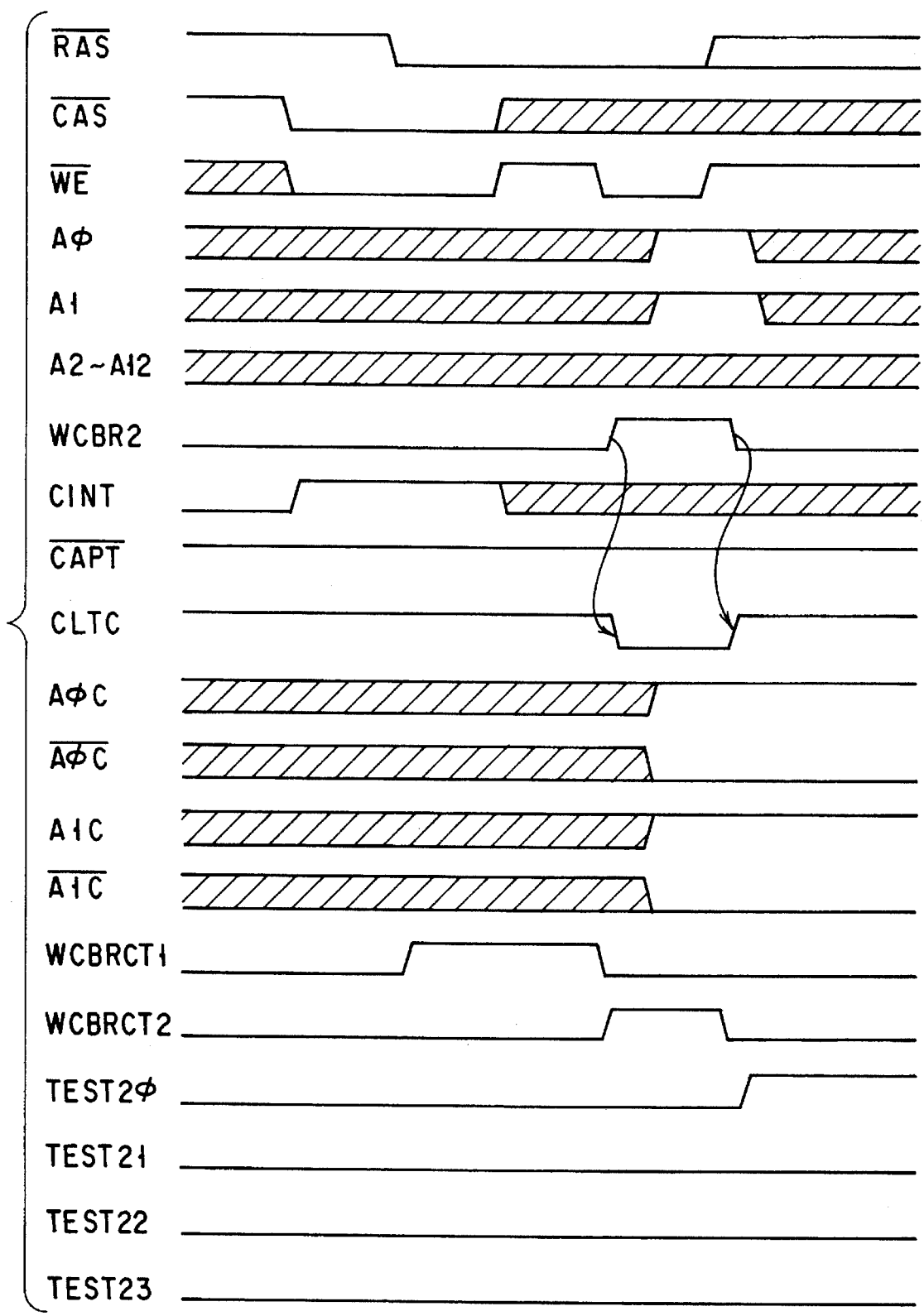
FIG. 44 is a detailed waveform timing chart for an operation of the tenth embodiment.

FIG. 44 is a detailed waveform timing chart for an operation of the tenth embodiment (where a /WE signal is counted twice).

This tenth embodiment is so designed that, after entering a WCBR cycle, the number of times signal /WE is made low is counted out if it is equal to or greater than two while signal /RAS is low and then the address inputs are checked for reference when signal /RAS returns high in order to discriminate the special function modes with which it is provided by using the obtained result of the reference so that it may be entered in a selected one of them.

While a number of alternative circuit configurations may be conceivable for this embodiment, it is so arranged that the CAB is reduced static and an external address may be taken in without altering it when /WE goes low twice or more than twice. After the completion of memory entry, the CAB is comes to be controlled in a conventional manner. An external address may alternatively be latched by mean of the RAB at a rising edge of /RAS after the number of times signal /WE is made low is counted out.

Note that signal WCBR2 which is the inverse of signal /WCHR2 to be generated in the RAB control circuit of FIG. 30 is used in the CAB control circuit of FIG. 43.

The eleventh embodiment of the invention will be described in detail below.

This eleventh embodiment is so designed that, after the start of a WCBR cycle, the number of times signal RAS is made low is counted out if it is equal to or greater than two while signal /CAS is low and then the address inputs are checked for reference when signal CAS returns inactive in order to discriminate the special function modes with which it is provided by using the obtained result of reference so that it may be entered in a selected one of them. The circuit configuration of the eleventh embodiment may be substantially the same as that of the tenth embodiment.

However, /CINT needs to be used in place of /PRCH as a flip-flop reset signal for generating signal WCBR2 for the RAB control circuit of FIG. 30 designed to supply the CAB control circuit 412 of FIG. 43 with signal WCBR2.

The twelfth embodiment of the invention will be described in detail below.

This twelfth embodiment is so designed that, after the start of a WCBR cycle, the number of times signal /CAS is made low is counted out if it is equal to or greater than two while signal /RAS is low and then the address inputs are checked for reference when signal RAS returns high in order to discriminate the special function modes with which it is provided by using the obtained result of reference so that it may be entered in a selected one of them. The circuit configuration of the eleventh embodiment may be substantially the same as that of the tenth embodiment.

The thirteenth embodiment of the invention will be described in detail below.

This thirteenth embodiment is so designed that, after entering a WCBR cycle, the number of times signal /WE is made low is counted out if it is equal to or greater than two while signal /RAS is low and then the I/O inputs are checked for reference when signal /RAS returns high in order to discriminate the special function modes with which it is provided by using the obtained result of reference so that it may be entered in a selected one of them.

While a number of alternative circuit configurations may be conceivable for this embodiment, it is difficult to reduce the CAB static and rake in external data without modifying it as in the case of the tenth example if a dynamic latch type Din buffer circuit is incorporated. If such is the case, the Din buffer circuit may be operated to latch I/O data when /RAS goes high after the last count.

The fourteenth embodiment of the invention will be described in detail below.

This fourteenth embodiment is so designed that, after the start of a WCBR cycle, the number of times signal /RAS is made low is counted out if it is equal to or greater than two while signal /CAS is low and then the I/O inputs are checked for reference when signal /CAS returns high in order to discriminate the special function modes with which it is provided by using the obtained result of reference so that it may be entered in a selected one of them.

The fifteenth embodiment of the invention will be described in detail below.

This fifteenth embodiment is so designed that, after the start of a WCBR cycle, the number of times signal /CAS is made low is counted out if it is equal to or greater than two while signal /RAS is low and then the I/O inputs are checked for reference when signal /RAS returns high in order to discriminate the special function modes with which it is provided by using the obtained result of reference so that it may be entered in a selected one of them.

As described in detail above, the existing standardized restrictions on a WCBR cycle may not necessarily be applied rigorously to a DRAM according to the invention to discriminate the two or more than two special function modes with which it is provided so that it may be entered in a selected one of them without problem. In other words, users who are not particularly conscious about the need of using special test modes may enter a DRAM according to the invention in a standardized test mode without departing from the timing of using a conventional WCBR cycle. Additionally, users who want to use a special test mode offered by the supplier may enter a DRAM according to the invention in that mode in a special entry cycle as described above. Thus, the present invention makes test modes of a large number of different types available to reduce the cost of testing.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A dynamic random access memory provided with special function modes of a plurality of different types, comprising a built-in entry circuit adapted to count the number of times a /WE signal is made active while a /RAS signal remains active since an WCBR cycle has been started to activate a /CAS signal and a /WE signal before a /RAS signal in order to discriminate the special function modes of a plurality of different types for memory entry according to the obtained count.

2. A dynamic random access memory according to claim 1, in which said entry circuit operates such that address inputs are checked for reference at the time when a /WE signal is made active for the last time but not for the first time to discriminate the special function modes with which it is provided according to the obtained result of the reference check and select one of the modes in which the memory is entered.

3. A dynamic random access memory according to claim 1, in which said entry circuit operates such that I/O inputs are checked for reference at the time when a /WE signal is made active for the last time but not for the first time to discriminate the special function modes with which it is provided according to the obtained result of the reference check and select one of the modes in which the memory is entered.

4. A dynamic random access memory according to claim 1, in which said entry circuit operates such that address inputs are checked for reference at the time when a /RAS signal returns inactive after a /WE signal is made active for the last time but not for the first time to discriminate the special function modes with which it is provided according to the obtained result of the reference check and select one of the modes in which the memory is entered.

5. A dynamic random access memory according to claim 1, in which said entry circuit operates such that I/O inputs are checked for reference at the time when a /RAS signal returns inactive after a /WE signal is made active for the last time but not for the first time to discriminate the special function modes with which it is provided according to the obtained result of the reference check and select one of the modes in which the memory is entered.

6. A dynamic random access memory provided with special function modes of a plurality of different types, comprising a built-in entry circuit adapted to count the number of times a /RAS signal is made active while a /CAS signal remains active since an CBR cycle has been started to activate a /CAS signal and a /WE signal before a /RAS signal in order to discriminate the special function modes of a plurality of different types for memory entry according to the obtained count.

7. A dynamic random access memory according to claim 6, in which said entry circuit operates such that address inputs are checked for reference at the time when a /RAS signal is made active for the last time but not for the first time to discriminate the special function modes with which it is provided according to the obtained result of the reference check and select one of the modes in which the memory is entered.

8. A dynamic random access memory according to claim 6, in which said entry circuit operates such that I/O inputs are checked for reference at the time when a /RAS signal is made active for the last time but not for the first time to discriminate the special function modes with which it is provided according to the obtained result of the reference check and select one of the modes in which the memory is entered.

9. A dynamic random access memory according to claim 6, in which said entry circuit operates such that address inputs are checked for reference at the time when a /CAS signal returns inactive after a /RAS signal is made active for the last time but not for the first time to discriminate the special function modes with which it is provided according to the obtained result of the reference check and select one of the modes in which the memory is entered.

10. A dynamic random access memory according to claim 6, in which said entry circuit operates such that I/O inputs are checked for reference at the time when a /CAS signal returns inactive after a /RAS signal is made active for the last time but not for the first time to discriminate the special function modes with which it is provided according to the obtained result of the reference check and select one of the modes in which the memory is entered.

11. A dynamic random access memory provided with special function modes of a plurality off different types, comprising a built-in entry circuit adapted to count the number of times a /CAS signal is made active while a /RAS signal remains active since an WCBR cycle has been started to activate a /CAS signal and a /WE signal before a /RAS signal in order to discriminate the special function modes of a plurality of different types for memory entry according to the obtained count.

12. A dynamic random access memory according to claim 11, in which said entry circuit operates such that address inputs are checked for reference at the time when a /CAS signal is made active for the last time but not for the first time to discriminate the special function modes with which it is provided according to the obtained result of the reference check and select one of the modes in which the memory is entered.

13. A dynamic random access memory according to claim 11, in which said entry circuit operates such that I/O inputs are checked for reference at the time when a /CAS signal is made active for the last time but not for the first time to discriminate the special function modes with which it is provided according to the obtained result of the reference check and select one of the modes in which the memory is entered.

14. A dynamic random access memory according to claim 11, in which said entry circuit operates such that address inputs are checked for reference at the time when a /RAS signal returns active after a /CAS signal is made active for the last time but not for the first time to discriminate the special function modes with which it is provided according to the obtained result of the reference check and select one of the modes in which the memory is entered.

15. A dynamic random access memory according to claim 11, in which said entry circuit operates such that I/O inputs are checked for reference at the time when a /RAS signal returns active after a /CAS signal is made active for the last time but not for the first time to discriminate the special function modes with which it is provided according to the obtained result of the reference check and select one of the modes in which the memory is entered.

16. A dynamic random access memory provided with special function modes of a plurality of different types, comprising:

a counter circuit including a plurality of flip-flops connected in series; and a counter control circuit for receiving a /WE signal and a /WE·/CAS before /RAS (WCBR) signal, said counter control circuit generating, every time the /WE signal is made active after the WCBR signal has been activated, a shift signal and supplying the shift signal to the flip-flops of said counter circuit to change the contents of the flip-flops, whereby the special function modes of different types are switched from one to another in accordance with the contents of the flip-flops of said counter circuit.

17. A dynamic random access memory according to claim 16, further comprising a latch circuit for latching the WCBR signal in an active state in which the /WE signal is made repeatedly active or inactive.

18. A dynamic random access memory according to claim 16, further comprising an entry circuit which receives address inputs and refers to the address inputs at the time when the /WE signal is made active for the last time, but not the first time, to switch the special function modes of different types from one to another in accordance with the result of the reference to the address inputs.

19. A dynamic random access memory according to claim 16, further comprising an entry circuit which receives I/O inputs and refers to the I/O inputs at the time when the /WE signal is made active for the last time, but not for the first time, to switch the special function modes of different types from one to another in accordance with the result of the reference to the I/O inputs.

20. A dynamic random access memory according to claim 16, further comprising an entry circuit which receives address inputs and refers to the address inputs at the time when a /RAS signal is made inactive after the /WE signal is made active for the last time, but not for the first time, to switch the special function modes of different types from one to another in accordance with the result of the reference to the address inputs.

21. A dynamic random access memory according to claim 16, further comprising an entry circuit which receives I/O inputs and refers to the I/O inputs at the time when a /RAS signal is made inactive after the /WE signal is made active for the last time, but not for the first time, to switch the special function modes of different types from one to another in accordance with the result of the reference to the I/O inputs.

22. A dynamic random access memory provided with special function modes of a plurality of different types, comprising:
   a counter circuit including a plurality of flip-flops connected in series; and
   a counter control circuit for receiving a /RAS signal and a /WE, /CAS before /RAS (WCBR) signal, said counter control circuit generating, every time the /RAS signal is made active after the WCBR signal has been activated, a shift signal and supplying the shift signal to the flip-flops of said counter circuit to change the contents of the flip-flops of said counter circuit, whereby the special function modes of different types are switched from one to another in accordance with the contents of the flip-flops of said counter circuit.

23. A dynamic random access memory according to claim 22, further comprising a latch circuit for latching the WCBR signal in an active state in which the /RAS signal is made repeatedly active or inactive.

24. A dynamic random access memory according to claim 22, further comprising an entry circuit which receives address inputs and refers to the address inputs at the time when the /RAS signal is made active for the last time, but not for the first time, to switch the special function modes of different types from one to another in accordance with the result of the reference to the address inputs.

25. A dynamic random access memory according to claim 22, further comprising an entry circuit which receives I/O inputs and refers to the I/O inputs at the time when the /RAS signal is made active for the last time, but not for the first time, to switch the special function modes of different types from one to another in accordance with the result of the reference to the I/O inputs.

26. A dynamic random access memory according to claim 22, further comprising an entry circuit which receives address inputs and refers to the address inputs at the time when a /CAS signal is made inactive after the /RAS signal is made active for the last time, but not for the first time, to switch the special function modes of different types from one to another in accordance with the result of the reference to the address inputs.

27. A dynamic random access memory according to claim 22, further comprising an entry circuit which receives I/O inputs and refers to the I/O inputs at the time a /CAS signal is made inactive after the /RAS signal is made active for the last time, but not for the first time, to switch the special function modes of different types from one to another in accordance with the result of the reference to the I/O inputs.

28. A dynamic random access memory provided with special function modes of a plurality of different types, comprising:
   a counter circuit including a plurality of flip-flops connected in series; and
   a counter control circuit for receiving a /CAS signal and a /WE-/CAS before /RAS (WCBR) signal, said counter control circuit generating, every time the /CAS signal is made active after the WCBR signal has been activated, a shift signal and supplying the shift signal to the flip-flops of said counter circuit to change the contents of the flip-flops, whereby the special function modes of different types are switched from one to another in accordance with the contents of the flip-flops of said counter circuit.

29. A dynamic random access memory according to claim 28, further comprising a latch circuit for latching the WCBR signal in an active state in which the /CAS signal is made repeatedly active or inactive.

30. A dynamic random access memory according to claim 28, further comprising an entry circuit which receives address inputs and refers to the address inputs at the time when the /CAS signal is made active for the last time, but not for the first time, to switch the special function modes of different types from one to another in accordance with the result of the reference to the address inputs.

31. A dynamic random access memory according to claim 28, further comprising an entry circuit which receives I/O inputs and refers to the I/O inputs at the time when the /CAS signal is made active for the last time, but not for the first time, to switch the special function modes of different types from one to another in accordance with the result of the reference to the I/O inputs.

32. A dynamic random access memory according to claim 28, further comprising an entry circuit which receives address inputs and refers to the address inputs at the time when a /RAS signal is made inactive after the /CAS signal is made active for the last time, but not for the first time, to switch the special function modes of different types from one to another in accordance with the result of the reference to the address inputs.

33. A dynamic random access memory according to claim 28, further comprising an entry circuit which receives I/O inputs and refers to the I/O inputs at the time when a /RAS signal is made inactive after the /CAS signal is made active for the last time, but not for the first time, to switch the special function modes of different types from one to another in accordance with the result of the reference to the I/O inputs.

34. A semiconductor memory device operable in a plurality of special function modes, comprising:
   counting circuitry for counting the number of times one of a /WE signal, a /CAS signal, and an /RAS signal is made active after a /WE and /CAS before /RAS (WCBR) clock sequence is generated; and
   a mode entry circuit for outputting a mode entry signal for entering said semiconductor memory device into one of said special function modes based on the count of said counting circuitry.

35. A semiconductor memory device according to claim 34, wherein said counting circuitry comprises:
   a counter comprising a plurality of flip-flop circuits connected in series; and
   a counter control circuit receiving the one /WE, /CAS, and /RAS signal and a WCBR signal and generating a shift signal which is supplied to said counter to change the contents of said flip-flop circuits.

36. A semiconductor memory device according to claim 35, wherein each of said flip-flop circuits comprise a master stage and a slave stage.

37. A semiconductor memory device according to claim 36, wherein said master stage comprises a CMOS clocked inverter and a flip-flop and the slave stage comprises a clocked inverter and a CMOS flip-flop.

38. A semiconductor memory device according to claim 34, wherein said mode entry circuit is supplied with address inputs and refers to the address inputs at the time when the one /WE, /CAS, and /RAS signal is made active for the last time, but not the first time, to output a mode entry signal for entering said semiconductor memory device into one of said special function modes based on the reference to the address inputs and the count of said counting circuitry.

39. A semiconductor memory device according to claim 34, wherein said mode entry circuit is supplied with I/O inputs and refers to the I/O inputs at the time when the one /WE, /CAS, and /RAS signal is made active for the last time, but not the first time, to output a mode entry signal for entering said semiconductor memory device into one of said special function modes based on the reference to the I/O inputs and the count of said counting circuitry.

* * * * *